United States Patent
Kondo et al.

[19]

[11] Patent Number: 6,097,492
[45] Date of Patent: Aug. 1, 2000

[54] WAFER DETECTION APPARATUS

[75] Inventors: Hisami Kondo; Hiroyuki Yoshida, both of Tokyo, Japan

[73] Assignee: Yamatake Corporation, Tokyo, Japan

[21] Appl. No.: 09/286,434

[22] Filed: Apr. 6, 1999

[30] Foreign Application Priority Data

Apr. 10, 1998 [JP] Japan .................................. 10-099546

[51] Int. Cl.[7] .................................................. G01B 11/14
[52] U.S. Cl. .......................................... 356/375; 250/548
[58] Field of Search .................................. 356/375, 376, 356/430; 250/548, 559.4, 224, 559.12

[56] References Cited

U.S. PATENT DOCUMENTS 4,806,773   2/1989   Hiraga et al. .
5,206,627   4/1993   Kato .

FOREIGN PATENT DOCUMENTS 6-85042   3/1994   Japan .

*Primary Examiner*—Frank G. Font
*Assistant Examiner*—Tu T. Nguyen
*Attorney, Agent, or Firm*—Morgan, Lewis & Bockius LLP

[57] ABSTRACT

A wafer detection apparatus for detecting wafers received in stages formed in a wafer carrier is provided which includes a light emitting section arranged movably in the thickness direction of wafers which are received in the stages along the peripheral wall of the wafer carrier, for emitting detection light toward the position of each stage for receiving a wafer, a light receiving section arranged movably in the thickness direction of the wafers for receiving the detection light emitted from the light emitting section and outputting a received light amount, a drive mechanism for moving the light emitting section and the light receiving section together relative to the wafer carrier, a storage device supplied with an input signal from the light receiving section and storing a history of change of the received light amount, and determining means for determining whether a wafer is received in each stage of the wafer carrier or not based on a received light amount curve indicative of change of the received light amount stored in the storage device.

19 Claims, 22 Drawing Sheets

⟨SINGLE WAFER RECEIVED⟩

⟨TWO OVERLAPPED WAFERS OR WARPED WAFER RECEIVED⟩

WAFER DETECTION APPARATUS

BACKGROUND OF THE INVENTION

1. Field of the Invention

The present invention relates to a wafer detection apparatus for detecting wafers and placements thereof contained in a wafer carrier, and more particularly, to a wafer detection apparatus suited for detecting overlapping of two wafers as well as a warp of a wafer.

2. Description of the Related Art

During the manufacture of silicon wafers, silicon wafers are subjected to a variety of processes such as cleaning, heating, CVD and photoresist coating, and thus need to be contained in a container for transportation between these processes. To permit a large number of silicon wafers or glass wafers to be contained, a container called wafer carrier is generally used. The wafer carrier has a plurality of stages formed on the inner walls of a casing thereof and wafers are received in the respective stages, so that a large number of wafers can be stacked up in such a manner as to face each other with a predetermined distance therebetween. To detect the number of wafers contained in a wafer carrier or the placements of the wafers, detecting means including a comb-type mapping sensor or detecting means utilizing movement of transmission-type photoelectric switches is used.

The comb-type mapping sensor has a plurality of reflection-type photoelectric sensing elements arranged in the form of comb teeth. In the case of using the detecting means having such a sensor, the teeth-like sensing elements are inserted into respective spaces between wafers which are stacked up so as to face each other with a predetermined distance therebetween, and detection light emitted from the light emitting elements and reflected by respective wafers is detected by the light receiving elements to thereby detect the presence/absence of wafers.

In the detecting means for detecting wafers while moving transmission-type photoelectric switches, on the other hand, transmission-type photoelectric switches are arranged on opposite sides of a wafer carrier so as to face each other and are moved vertically relative to the wafer carrier, and the presence/absence of each wafer in the wafer carrier is detected by determining whether or not the amount of light received by the photoelectric switch is greater than a fixed threshold, as disclosed in Unexamined Japanese Patent Publication (KOKAI) No. 6-85042, for example.

According to the wafer detection technique using the comb-type mapping sensor, the number of wafers and the placements thereof can be detected at a time by simply inserting the teeth-like elements into respective spaces between the wafers, as shown in FIG. 22, but if the wafer carrier is sealed up with wafers contained therein, the mapping sensor interferes with the wafer carrier, making it impossible to perform the wafer detection. Namely, with the comb-type mapping sensor, -the presence/absence of wafers cannot be detected from outside of the wafer carrier, and to detect wafers by means of the comb-type mapping sensor, it is necessary that part of the wafer carrier, for example, a cover thereof, should be opened to allow the teeth-like sensing elements to be inserted from the opening into respective spaces between the wafers.

According to this detection method, therefore, wafers cannot be kept in a sealed state and thus the cleanliness thereof cannot be maintained at high level throughout the manufacture of wafers, with the result that the yield of wafers lowers.

Also, in this detection method, the presence/absence of each wafer is detected based on light reflected from the peripheral edge portion of the wafer; accordingly, when two wafers are overlapped one upon the other inside the carrier, the presence of the wafers alone can be detected and such overlapping of two wafers cannot be detected. Similarly, when a wafer is received slantingly inside the carrier, only the presence of the wafer can be detected and such inclination of the wafer cannot be detected. Further, even if a wafer is warped, such a warp fails to be detected, though the presence of the wafer can be detected.

If a wafer is placed slantingly, moreover, the teeth-like elements of the mapping sensor may come into contact with the peripheral edge portion of the inclined wafer during the wafer detection, possibly damaging or breaking the wafer.

Furthermore, the mapping sensor has an extremely complicated structure and is expensive, and since the presence/absence of wafers cannot be detected properly if only one of the photoelectric sensing elements of the mapping sensor fails, the expensive sensor must be replaced with new one each time such fault occurs.

In the detecting means in which transmission-type photoelectric switches are moved for wafer detection, detection light can be emitted from outside the wafer carrier toward a wafer and received by the light receiving section also located outside the carrier, and it is therefore unnecessary to open part of the wafer carrier when the presence/absence of wafers is to be detected. Namely, the presence/absence of wafers can be detected with the wafers sealed in the wafer carrier and thus the cleanliness of the wafers can be maintained. However, this detecting means simply judges that a wafer is present if the amount of light received by the photoelectric sensor is greater than a fixed threshold; therefore, in cases where wafers are detected from outside the carrier, a flaw or a parting line on the surface of the wafer carrier can be erroneously detected as a wafer.

Further, with this detection technique in which the amount of received light is compared with a fixed threshold, even when a wafer is placed slantingly or two wafers are overlapped one upon the other, it is judged simply that a wafer is present, and such improper wafer placement cannot be detected. Similarly, even if a wafer is warped, it is only judged that a wafer is present, and the warp of the wafer fails to be detected.

SUMMARY OF THE INVENTION

An object of the present invention is to provide a wafer detection apparatus capable of accurately determining whether or not wafers are received in a wafer carrier.

Another object of the present invention is to provide a wafer detection apparatus capable of detecting improper placement of wafers in the wafer carrier, such as overlapping of two wafers, warp of wafers and the like.

To achieve the above objects, the present invention provides a wafer detection apparatus for detecting wafers received in stages formed in a wafer carrier, comprising: a light emitting section arranged movably in a thickness direction of wafers which are received in the stages along a peripheral wall of the wafer carrier, for emitting detection light toward a position of each stage for receiving a wafer; a light receiving section arranged movably in the thickness direction of the wafers, for receiving the detection light emitted from the light emitting section and outputting a received light amount; a drive mechanism for moving the light emitting section and the light receiving section together relative to the wafer carrier; a storage device supplied with an input signal from the light receiving section and storing a history of change of the received light amount; and determining means for determining whether a wafer is received in each stage of the wafer carrier or not based on a received light amount curve indicative of change of the received light amount stored in the storage device.

With this preferred arrangement, the presence/absence of wafers in a wafer carrier can be detected without the need to use a comb-type mapping sensor, unlike the conventional apparatus. During the detection, therefore, wafers are never damaged or broken. Also, since the number of light emitting and receiving devices used is extremely small compared with a comb-type mapping sensor conventionally used, the possibility of a fault or the like occurring in the detecting section is small, permitting reliable wafer detection.

Further, unlike the conventional detection apparatus using a transmission-type photoelectric sensor, the presence/absence of wafers is detected not simply in accordance with whether or not the amount of received light exceeds (falls below) a predetermined threshold, but based on the curve indicative of change of the received light amount, whereby the presence/absence of wafers can be detected with accuracy.

Preferably, the wafer detection apparatus according to the present invention further comprises a position sensor for successively acquiring information on position of the light emitting section and the light receiving section relative to the wafer carrier and supplying the acquired information to the storage device as detection position information.

The use of the position sensor makes it possible to associate the received light amount curve accurately with each of the detection positions at which the light receiving section detects the received light amount.

In the wafer detection apparatus of the present invention, preferably, the light receiving section is a transmitted light-detection type, and the determining means detects a state of placement of each wafer based on a near-peak region of change of the received light amount defined by a range in which a differential indicative of change of the received light amount is zero and which starts from a point at which the differential changes from a negative value to zero.

With this preferred arrangement, unlike the conventional detection apparatus using a transmission-type photoelectric sensor, wafers are detected not simply in accordance with whether or not the amount of received light exceeds a predetermined threshold, but based on the near-peak region of change of the received light amount, whereby not only the presence/absence of wafers in a wafer carrier but also the placements thereof can be detected with accuracy.

In the wafer detection apparatus according to the present invention, preferably, the light receiving section is a reflected light-detection type, and the determining means detects a state of placement of each wafer based on a near-peak region of change of the received light amount defined by a range in which a differential indicative of change of the received light amount is zero and which starts from a point at which the differential changes from a positive value to zero.

With this preferred arrangement, not only the presence/absence of wafers in a wafer carrier but also the placements thereof can be detected using a reflection-type photoelectric sensor, based on the near-peak region of change of the received light amount.

Preferably, in the wafer detection apparatus of the present invention, the determining means detects a state of placement of each wafer based on an area of a received light variation region which is defined by a fixed reference value and a portion of the received light amount curve exceeding the fixed reference value.

The area of the received light variation region defined by the fixed reference value and a portion of the received light amount curve exceeding the fixed reference value greatly varies depending on whether one or more wafers are received or whether a wafer is warped or not; therefore, with the preferred arrangement, not only the presence/absence of wafers but improper placement of wafers, such as overlapping of two wafers or a warp of a wafer, can be detected without fail based on the area of the received light variation region.

Preferably, the determining means of the wafer detection apparatus of the present invention detects a state of placement of each wafer based on a width of a received light variation region which is defined between adjacent minimal and maximal points of a differential indicative of change of the received light amount varying with the detection position information, as well as on a peak value of the received light amount in the received light variation region.

The width and peak value of the received light variation region defined between adjacent minimal and maximal points of the differential indicative of change of the received light amount varying with the detection position information greatly vary depending on whether one or more wafers are received or whether a wafer is warped or not. With this preferred arrangement, therefore, not only the presence/absence of wafers but improper placement of wafers, such as overlapping of two wafers or a warp of a wafer, can be detected without fail based on the width and peak value of the received light variation region.

In the wafer detection apparatus of the present invention, preferably, the determining means detects a state of placement of each wafer based on a width of a received light variation region which includes adjacent minimal and maximal points of a differential indicative of change of the received light amount varying with the detection position information and which is defined between a point at which the differential changes from zero to a negative value and a point at which the differential changes from zero to a positive value, as well as on a peak value of the received light amount in the received light variation region.

The width and peak value of the received light variation region which includes adjacent minimal and maximal points of the differential indicative of change of the received light amount varying with the detection position information and which is defined between a point at which the differential changes from zero to a negative value and a point at which the differential changes from zero to a positive value greatly vary depending on whether one or more wafers are received or whether a wafer is warped or not. With this preferred arrangement, therefore, not only the presence/absence of wafers but improper placement of wafers, such as overlapping of two wafers or a warp of a wafer, can be detected without fail based on the width and peak value of the received light variation region.

Preferably, in the wafer detection apparatus, the light emitting section emits the detection light to each wafer through the wafer carrier, and the light receiving section receives the detection light from the wafer through the wafer carrier.

With this preferred arrangement, the presence/absence and placements of wafers can be detected with the wafers sealed in a wafer carrier, and accordingly, cleanliness of wafers can be maintained.

The wafer detection apparatus preferably comprises correcting means whereby the detection light is emitted to a predetermined position of a reference wafer carrier at which no wafer is received, an amount of the detection light received in this case is set as a reference received light amount, the detection light is emitted to a position of a wafer carrier with respect to which placements of wafers are to be detected, the position corresponding to the predetermined position, and an amount of the detection light received at this time is compared with the reference received light amount to calculate a received light correction value.

With this preferred arrangement, wafer detection is performed after correction of the received light amount, whereby the presence/absence and placements of wafers can be detected accurately at all times without being influenced by difference in type of wafer carriers or by variation with time.

The determining means of the wafer detection apparatus preferably has a function of judging that a wafer is properly received if the near-peak region of change of the received light amount falls within a range of wafer detection position in which a wafer is to be received and also if the near-peak region exceeds a predetermined threshold and has a width smaller than a predetermined width.

With the preferred arrangement, since the near-peak region of change of the received light amount falls within the range in which a wafer is to be received and at the same time the near-peak region exceeds the predetermined threshold, it is judged that a wafer is present in the region, and also since the width of the near-peak region does not exceed the predetermined width, it can be judged that the wafer is properly received in a wafer receiving position of a wafer carrier.

Preferably, the determining means of the wafer detection apparatus has a function of judging that two overlapped wafers or a warped wafer is received if the near-peak region of change of the received light amount falls within a range of wafer detection position in which a wafer is to be received and also if the near-peak region exceeds a predetermined threshold and has a width greater than a predetermined width.

With the preferred arrangement, since the near-peak region of change of the received light amount falls within the range in which a wafer is to be received and at the same time the near-peak region exceeds the predetermined threshold, it is judged that a wafer or wafers are present in the region, and also since the width of the near-peak region exceeds the predetermined width, it can be judged that two overlapped wafers or a warped wafer is received.

The determining means of the wafer detection apparatus preferably has a function of judging that a wafer is improperly received because of inclined placement etc. if the near-peak region of change of the received light amount is outside a range of wafer detection position in which a wafer is to be received and also if the near-peak region exceeds a predetermined threshold.

With this preferred arrangement, it can be judged that there is a wafer obstructing the propagation of the detection light over a wide range exceeding the wafer receiving section, and thus a conclusion is made that the wafer is improperly received because of inclined placement or the like.

Preferably, the determining means of the wafer detection apparatus has a function of judging that the wafer carrier has a flaw or a parting line if the near-peak region of change of the received light amount is outside a range of wafer detection position in which a wafer is to be received and also if the near-peak region does not exceed a predetermined value.

With this preferred arrangement, it can be judged that there is an object other than the wafer receiving section that scatters the detection light but not to such an extent as is scattered by a wafer, and such an object is regarded as a flaw or a parting line of the wafer carrier and is ignored.

The above and other objects, features and advantages of the present invention will become apparent from the following description.

DETAILED DESCRIPTION OF THE PREFERRED EMBODIMENTS

A wafer detection apparatus according to the present invention will be hereinafter described with reference to the drawings.

Figure 1:
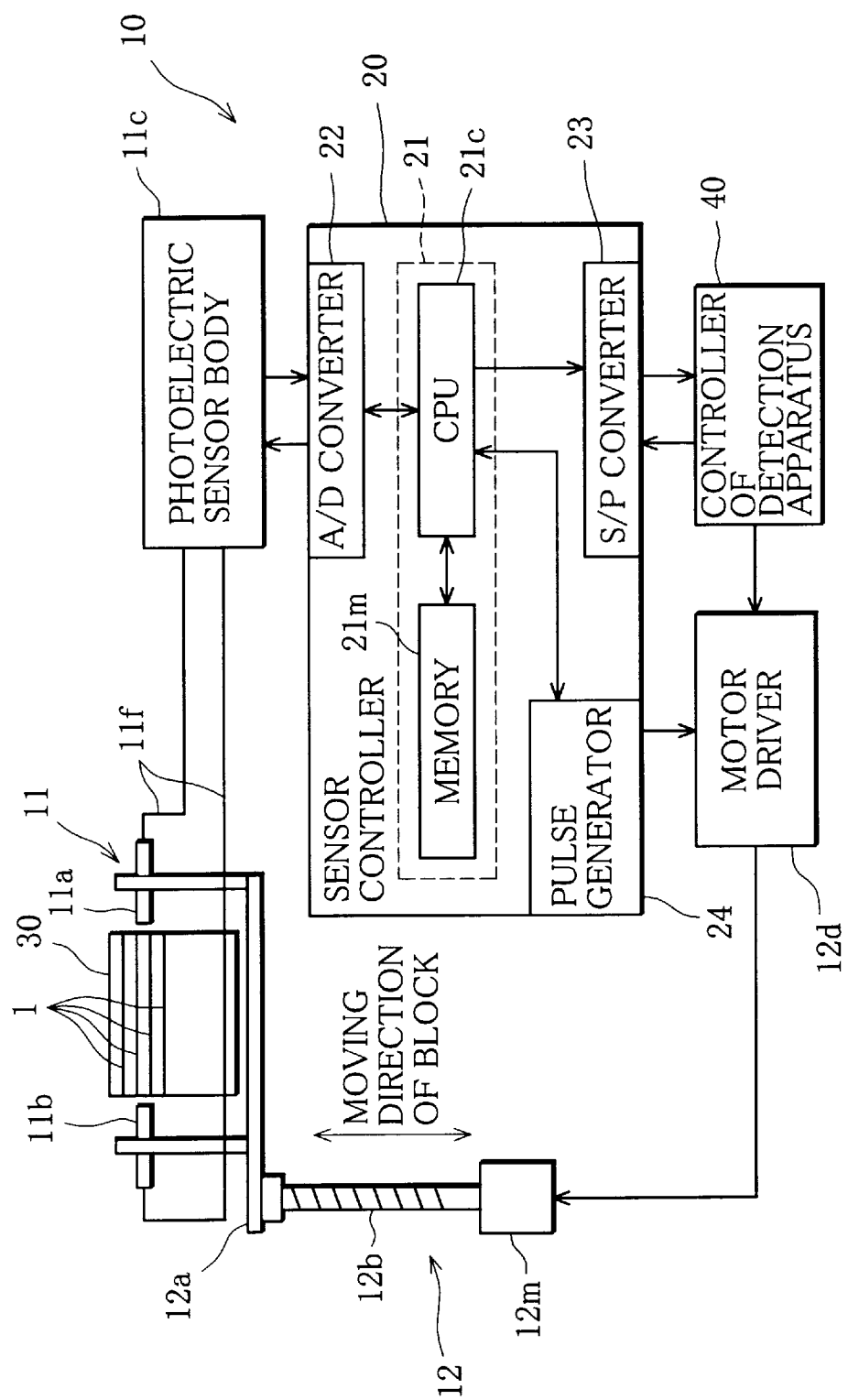
FIG. 1 is a schematic diagram showing the arrangement of a wafer detection apparatus according to the present invention.
Figure 2:
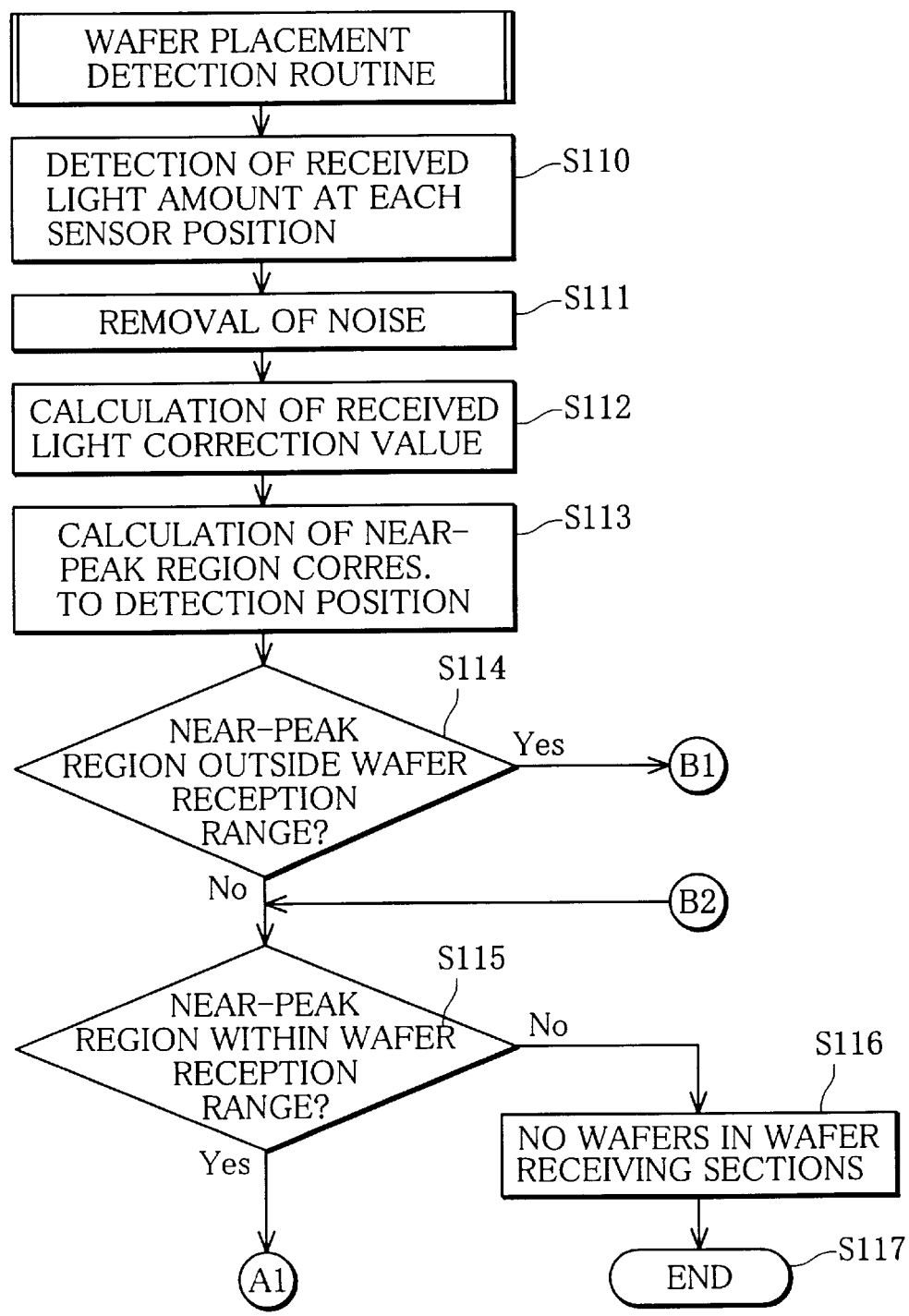
FIG. 2 is part of a flowchart showing a procedure for detecting the presence/absence and placements of wafers according to a first embodiment of the present invention.
Figure 3:
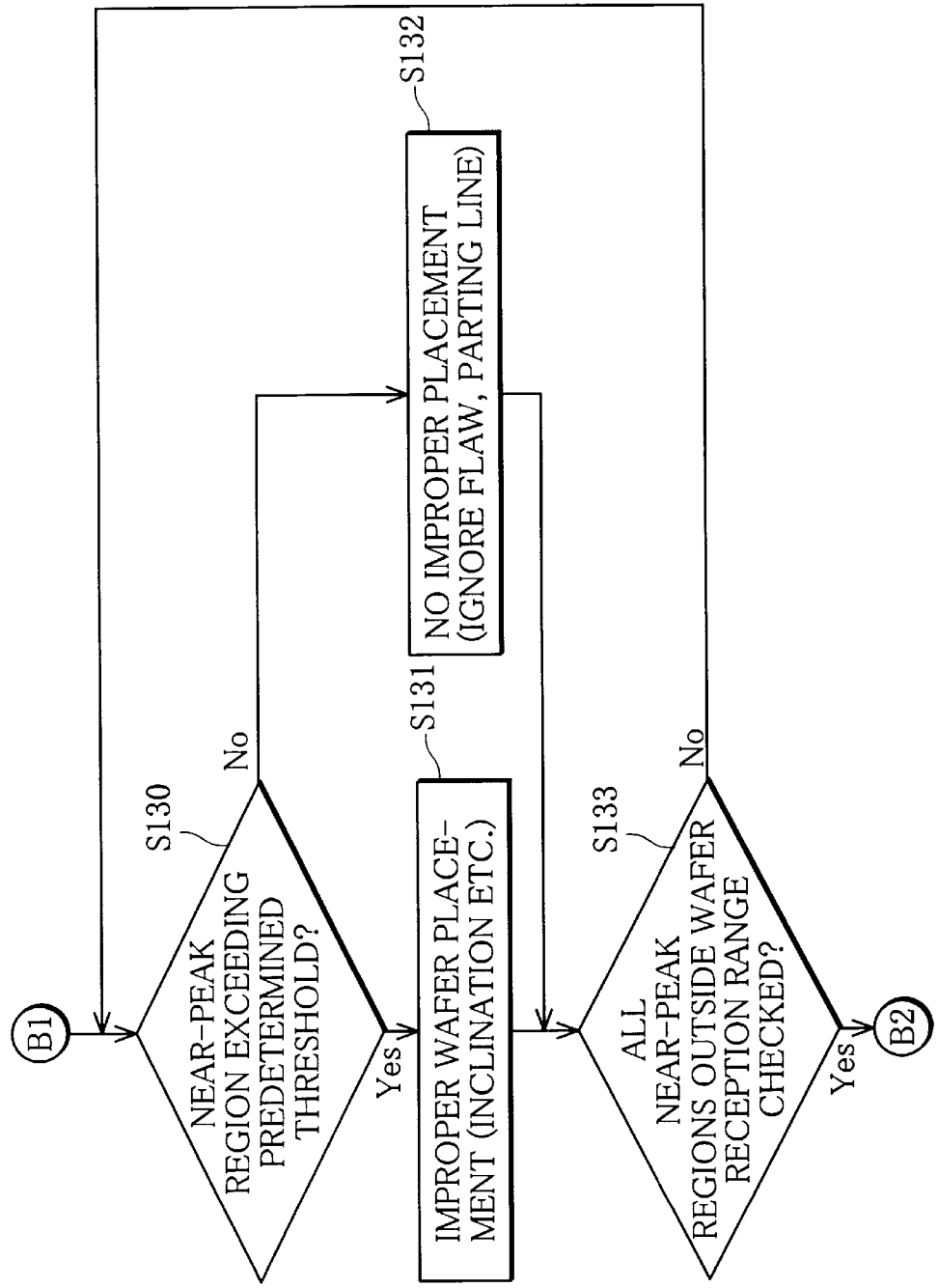
FIG. 3 is a part of the flowchart following the part shown in FIG. 2.
Figure 4:
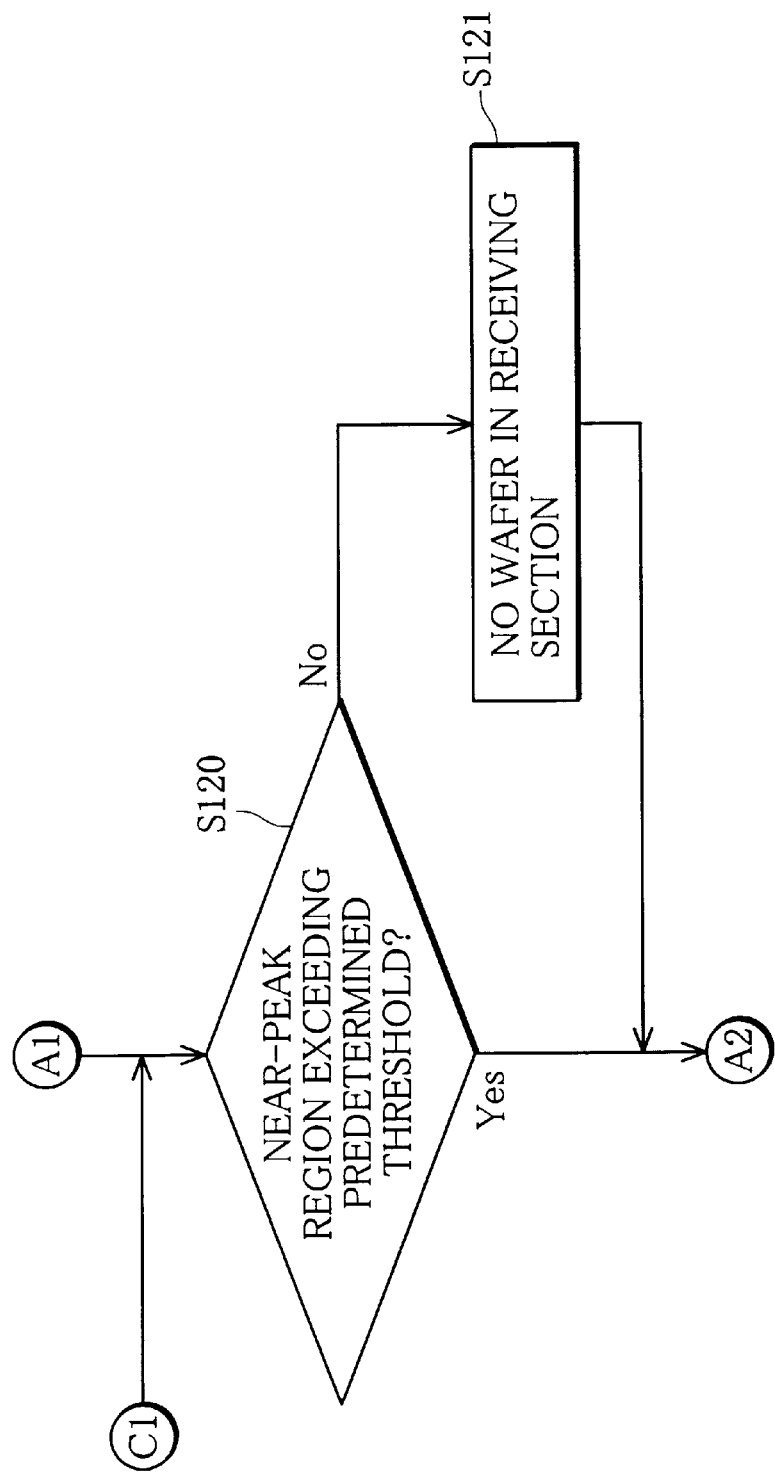
FIG. 4 is another part of the flowchart following the part shown in FIG. 2.
Figure 5:
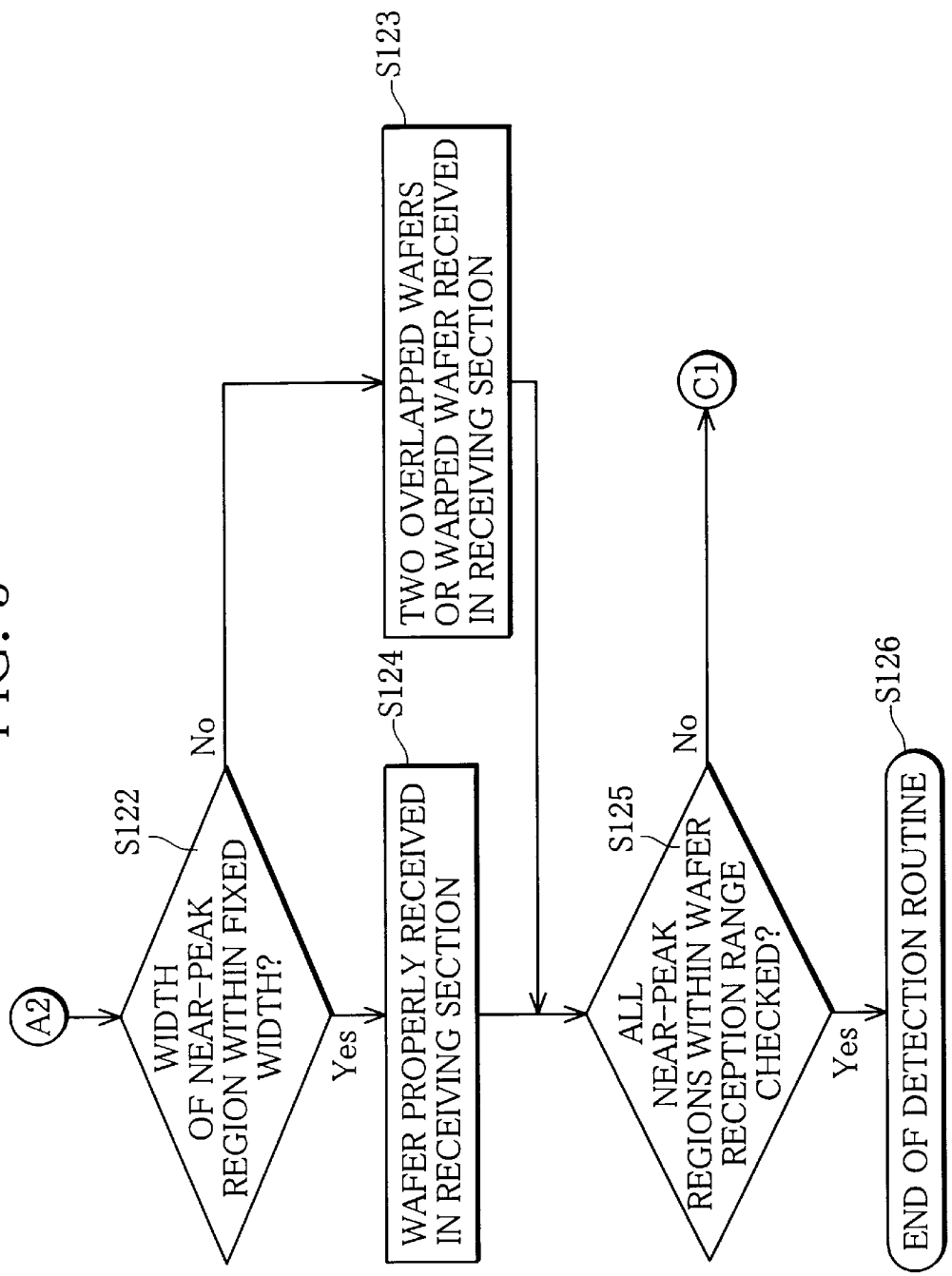
FIG. 5 is the remaining part of the flowchart following the part shown in FIG. 4.

A wafer detection apparatus 10 shown in FIG. 1, which is a first embodiment of the present invention, comprises a photoelectric sensor 11 for emitting detection light to each wafer 1 and receiving the detection light, a drive mechanism 12 for moving the photoelectric sensor 11 along a wafer carrier 30, a sensor controller 20 for detecting the state of placement of each wafer 1 in the carrier 30 based on the light received at each detection position of the photoelectric sensor 11 moved by the drive mechanism 12, etc.

The photoelectric sensor 11 is a transmitted light-detection type and comprises a photoelectric sensor body 11c incorporating therein a light emitting device and a light receiving device, optical fibers 11f optically connected to the light emitting device and the light receiving device, respectively, of the photoelectric sensor body 11c, a light emitting section (a light emitting head) 11a and a light receiving section (a light receiving head) 11b provided at ends of the respective optical fibers 11f, etc. Instead of the optical fibers 11f, electric cables may alternatively be used with light emitting and receiving devices provided at ends of the respective cables as the light emitting and receiving sections 11a and 11b, respectively. The light emitting section 11a and the light receiving section 11b are arranged on opposite sides of the wafer carrier 30 so as to face each other.

Wafer receiving stages (wafer receiving sections) are formed on inner walls of the wafer carrier 30 facing each other and are spaced from each other at a predetermined distance to receive wafers 1 such that a predetermined number of wafers (e.g., 13 or 25 wafers) of 300 mm in diameter can be stacked one upon another at the predetermined distance therebetween. The wafer carrier 30 is made of a material capable of transmitting the detection light therethrough. When the detection light is emitted from the light emitting section 11a, the amount of light received by the light receiving section 11b decreases substantially if a wafer 1 is present in the optical path of the detection light, and does not decrease if the detection light directly reaches the light receiving section 11b without passing through the wafer 1. If the wafer carrier 30 has a flaw or a parting line in a portion thereof and the detection light passes through such a portion, part of the detection light scatters and thus the amount of received light slightly decreases.

The light emitting section 11a and the light receiving section 11b are mounted on a ball screw 12b via an axially movable sensor slide block 12a and are moved along sides of the wafer carrier 30 (in a vertical direction as shown in FIG. 1) by a pulse motor 12m attached to one end of the ball screw 12b. The wafer carrier 30 can be held in a fixed position by holding means, not shown. The pulse motor 12m is supplied with drive pulses from a pulse generator 24, and information on detection position of the light receiving section 11b is successively supplied to a CPU 21c, described later.

The photoelectric sensor body 11c is electrically connected to the sensor controller 20, and the pulse motor 12m is also electrically connected to the sensor controller 20 via a motor driver 12d. Further, the sensor controller 20 and the motor driver 12d are electrically connected to a controller 40 of the detection apparatus.

The sensor controller 20 comprises a determining section 21 including a storage device, that is, a memory 21m, and the CPU 21c and serving as determining means for detecting the presence/absence of each wafer 1 as well as the state of placement thereof, an A/D converter 22 connected between the determining section 21 and the sensor body 11c, an S/P converter 23 connected between the controller 40 and the determining section 21, the aforementioned pulse generator 24 connected between the motor driver 12d and the determining section 21, etc.

Referring now to the flowcharts of FIGS. 2 through 5, how the presence/absence and placements of wafers are detected using the wafer detection apparatus 10 constructed as above will be described.

To detect wafers and placements thereof, the pulse motor 12m is driven to move the light emitting section 11a and the light receiving section 11b of the photoelectric sensor 11 along the wafer carrier 30 and detection light is emitted and received by the sensor 11 during the movement to detect the amount of light received at each detection position (Step 110). The detection analog output of the photoelectric sensor is subjected to A/D conversion at the A/D converter 22, and the resulting data indicative of the amount of received light at each detection position is supplied to the determining section 21. Subsequently, the received light amount data obtained at each detection position is subjected to a smoothing process to remove noise (Step 111). As such smoothing for removing noise, S/W (software) filtering is performed inside the CPU 21c. Alternatively, H/W (hardware) filtering may be performed inside the photoelectric sensor body 11c. This smoothing process provides detection data indicative of the received light amount at each detection position, as indicated by the broken lines in FIG. 6, which data is then stored in the memory 21m.

Figure 6:
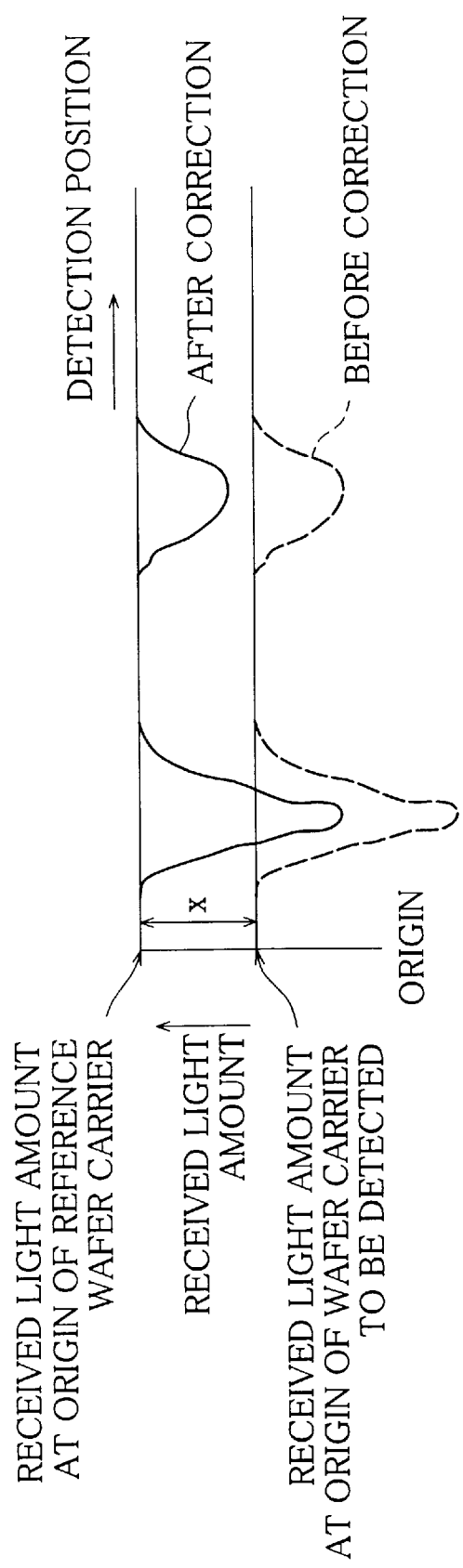
FIG. 6 is a diagram illustrating correction of the amount of received light performed in the wafer detection apparatus according to the present invention.

The received light amount is then subjected to automatic correction (Step 112). The correction is carried out in order to absorb changes in the state of transmission of the detection light through the wafer carrier caused due to difference in type of wafer carriers and variation with time. Specifically, a reference wafer carrier is selected in advance, and with the photoelectric sensor located at a predetermined position (hereinafter referred to as "origin") of the reference wafer carrier where the detection light does not pass through a wafer, the amount of received light is measured and stored in the memory 21m as a reference value. Then, the amount of received light obtained at the origin of the wafer carrier 30, with respect to which the presence/absence and placements of wafers are to be detected, is compared with the reference value, and a deviation between the two is set as a correction value. In FIG. 6, the correction value is indicated at x. Using the correction value, the received light amount at each detection position, obtained in Step 111, is corrected. The correction may be achieved by simply shifting the measured amount of received light (adding or subtracting the correction value); alternatively, where the carrier has a transmittance different from that of the reference carrier, multiplication may be performed for proportional correction. The above reference value may be measured only once so that it can be used repeatedly thereafter when wafers in individual wafer carriers are to be detected; alternatively, the reference value may be measured for each wafer carrier to be used in the detection of wafers therein. As a result of the correction, corrected data of the received light amount indicated by the solid lines in FIG. 6 is obtained.

Figure 7:
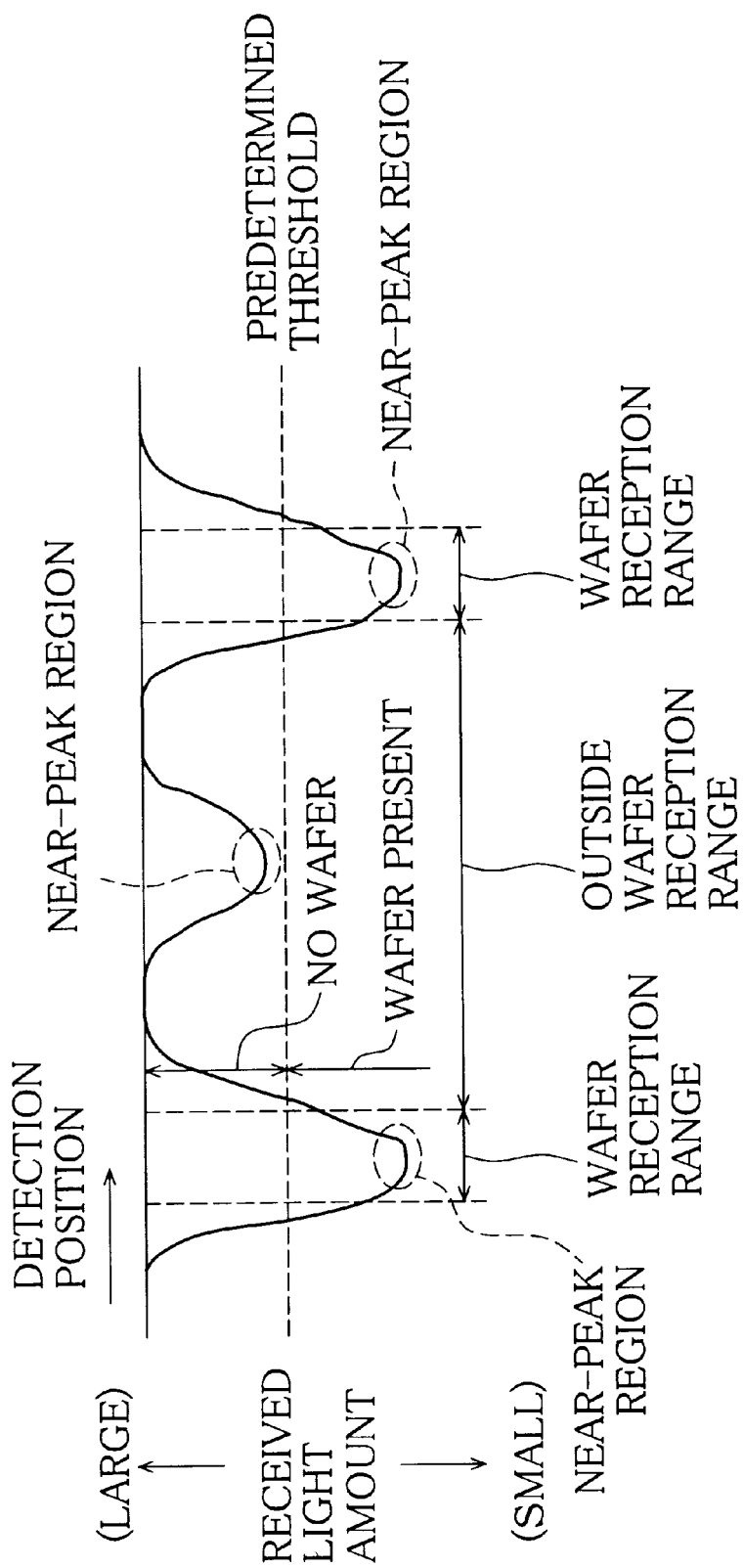
FIG. 7 is a diagram illustrating how the presence/absence and placements of wafers are detected by the wafer detection apparatus according to the present invention.

FIG. 7 shows an example of received light amount data obtained by subjecting the received light amount data obtained at each detection position by the photoelectric sensor 11 to the noise removing process and the correction process. Based on this received light amount data, the presence/absence and placement of each wafer are detected following the procedure described below.

The CPU 21c calculates the gradient of the curve of the received light amount data shown in FIG. 7 and obtains, as a near-peak region, a region of the curve in which the differential indicative of change in received light amount is zero (Step 113). The near-peak region may include a region in which the differential is very small and nearly equal to zero.

In this embodiment, that is, where the light emitting and receiving sections of the sensor are transmitted light-detection type, the region in which the differential indicative of change in received light amount is zero corresponds to a bottom of the curve shown in FIG. 7; on the other hand, where the sensor used is a reflected light-detection type unlike the embodiment, the region corresponds to a ceiling or peak region in a similar graph showing change in received light amount. Thus, the near-peak region is a region in which the first-order differential of received light amount is substantially zero, and not a region in which the second-order differential of same is substantially zero.

Simultaneously with the calculation of the differential, the smoothing process for removing noise may also be performed.

As a result of the calculation of the differential, three near-peak regions, for example, are obtained as shown in FIG. 7. The near-peak regions detected in this case include a near-peak region indicative of a wafer as well as a near-peak region indicative of a flaw including a parting line, etc. To detect the presence/absence of wafers, therefore, it is necessary to exclude a near-peak region indicative of a flaw etc. of a wafer carrier including a parting line from the near-peak regions calculated in Step 113. The near-peak region to be excluded can be detected at a position falling within a range where a wafer should originally be received and at a position outside the range, and false near-peak regions detected at such positions are excluded following the procedure described below.

First, it is determined whether or not the detected near-peak region is outside a wafer reception range which includes a wafer receiving section (stage) and its nearby regions (Step 114). The light receiving section of the photoelectric sensor 11 receives the detection light while being moved at a predetermined speed by the pulse motor 12m along the ball screw 12b, and information on the position of the photoelectric sensor 11 is successively provided to the CPU 21c from the pulse generator 24. Accordingly, whether the detection position of the sensor 11 is within the wafer reception range or not, as shown in FIG. 7, can be easily determined.

If the near-peak region is outside the wafer reception range, it is determined whether or not the near-peak region exceeds (falls below) a predetermined threshold (Step 130). The predetermined threshold is a prescribed value obtained based on experiments conducted with respect to individual types of wafer carrier 30, wafers, etc., and in the case of the transmission-type photoelectric sensor 11, is set to a value slightly smaller than an amount of received light observed when the light has passed through a parting line as equivalent to the greatest allowable flaw. If the predetermined threshold is exceeded, that is, if the received light amount is smaller than the threshold shown in FIG. 7, then it means that some obstacle obstructing the propagation of the detection light is present at a position where a wafer should originally not be located, and it is judged as the most probable situation that a wafer is improperly received, for example, slantingly received, in the nearest wafer receiving section (Step 131). On the other hand, if the predetermined threshold is not exceeded, that is, if the received light amount is not smaller than the threshold shown in FIG. 7, it is judged that a reduction in the received light amount has been merely caused by scattering of part of the detection light by a flaw or a parting line of the wafer carrier 30, and not by a wafer or some other obstacle, and a conclusion is made that there is no improper placement of wafer, ignoring such a slight reduction of the received light amount (Step 132). In FIG. 7, the predetermined threshold is set at a value slightly smaller than an amount of received light observed when the light has passed through a parting line as equivalent to the greatest allowable flaw.

It is then determined whether or not the aforementioned Steps 130 to 132 have been executed for all near-peak regions detected outside the wafer reception range (Step 133), and if not, the steps are repeatedly executed for the remaining near-peak regions.

Subsequently, it is determined whether or not there is a near-peak region detected within the wafer reception range (Step 115); if not, it is judged that no wafer is received in the wafer receiving sections of the wafer carrier (Step 116) and the detection of wafers is ended (Step 117).

If there is a near-peak region detected in the vicinity of the wafer receiving section (within the wafer reception range), it is determined whether or not the predetermined threshold is exceeded by the near-peak region (Step 120). If the predetermined threshold is not exceeded by the near-peak region, it is judged that the detection light has not passed through a wafer, and accordingly, that there is no wafer in the receiving section concerned (Step 121). Thus, even when no wafer is present in the wafer reception range and at the same time a flaw, a parting line or the like exists in this reception range of the wafer carrier 30, such a flaw or a parting line is ignored, as in the case of Step 132.

Figure 8:
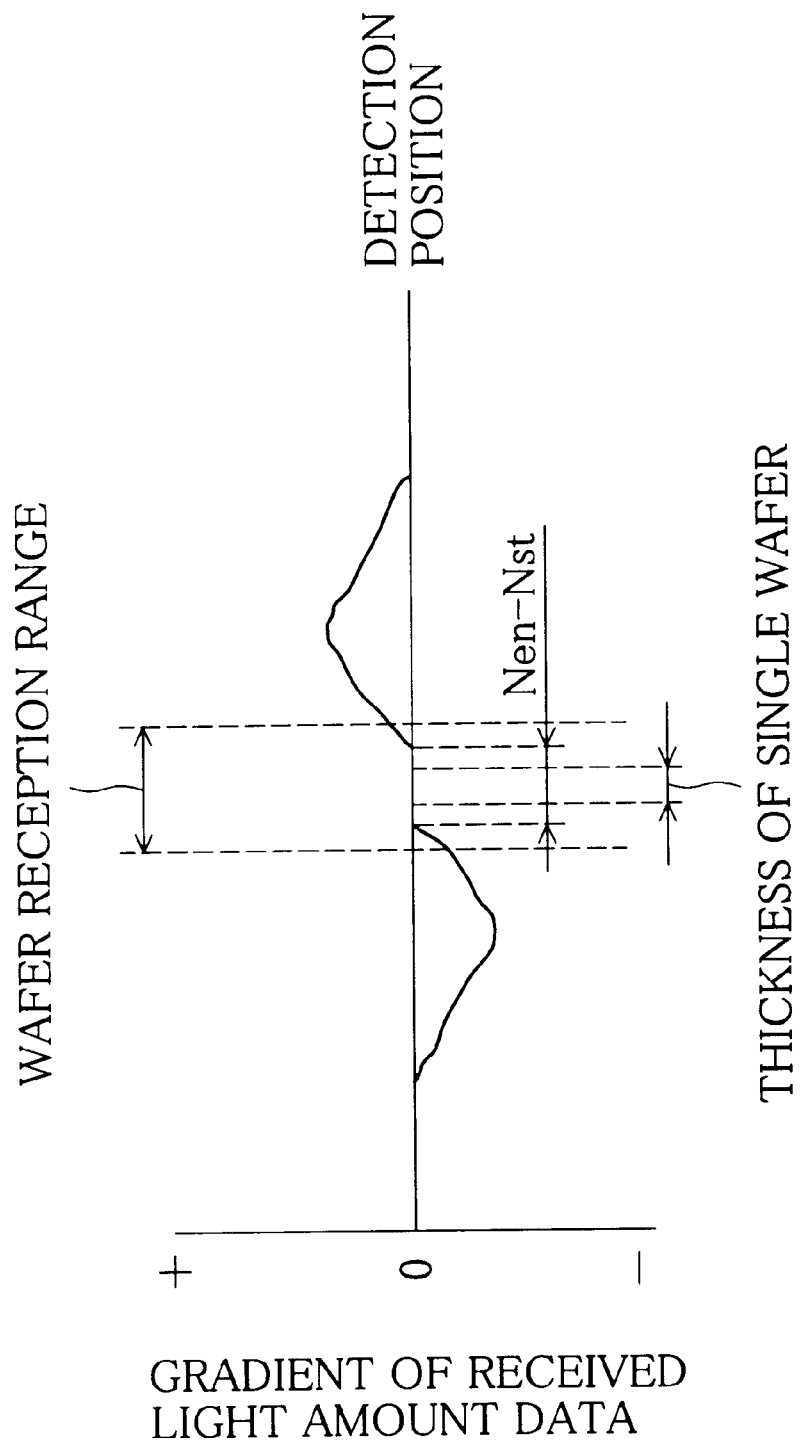
FIG. 8 is a diagram illustrating how the placement of a wafer is detected in the vicinity of a wafer receiving position by the wafer detection apparatus according to the present invention.
Figure 9:
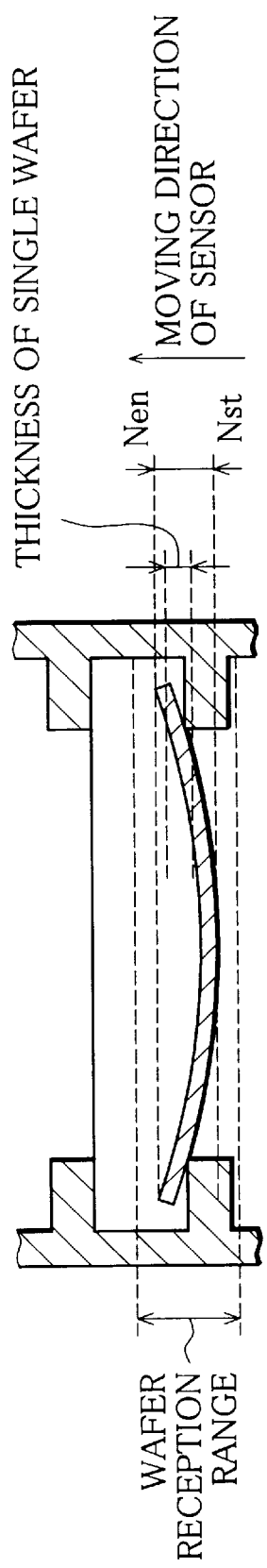
FIG. 9 is a view showing a state in which a warped wafer is contained in a wafer carrier.

Subsequently, it is determined whether or not the width of the near-peak region is within a fixed width (Step 122). If the width of the near-peak region is greater than the fixed width, it is judged that two overlapped wafers or a warped wafer is received in the receiving section concerned (Step 123). Specifically, such wafer placement is detected when a difference $N_{en} - N_{st}$ between the end point $N_{en}$ and the start point $N_{st}$ of the near-peak region in which the gradient of the curve of the received light amount data is zero is greater than the thickness of one wafer but falls within the wafer reception range (Step 123), as shown in FIGS. 8 and 9.

The fixed width is therefore set in advance to a value corresponding to the thickness of one wafer.

If the fixed width is exceeded, then the detection light is weakened over a range not so wide as in the case where a wafer is slantingly received but greater than the thickness of one wafer, and thus it is judged as the most probable situation that two overlapped wafers or a warped wafer is received.

On the other hand, if the width of the near-peak region is found to be within the fixed width, it is judged that a wafer is properly received in the receiving section concerned (Step 124).

The aforementioned Steps 120 through 124 are executed for all near-peak regions within the wafer reception ranges, and the detection of the presence/absence and placements of wafers is ended (Step 126). The detection results obtained by the sensor controller 20 are output to the controller 40.

It is to be noted that the detection routine described above is given just as an example of the procedure for detecting the presence/absence and placements of wafers, and other detection routines may of course be conceivable without departing from the spirit and scope of the invention in the appended claims.

For example, a determination may be made first as to whether or not a near-peak region exists in the wafer reception ranges, followed by execution of Steps 120 to 125 if such a near-peak region exists, and then a determination may be made as to whether or not there is a near-peak region detected outside the wafer reception ranges, following by execution of Steps 130 to 133 if such a near-peak region exists.

Also, objects to be detected are not limited to semiconductor wafers, and the present invention can be applied to detection of the presence/absence and placements of hard disks or CDs (compact disks) contained in cassettes.

Further, although a transmission-type photoelectric sensor is used in the above embodiment, a reflection-type photoelectric sensor may alternatively be used in such a manner that based on a near-peak region derived from a differential of the amount of reflected light, the state of placement of each wafer is detected. In this case, since the amount of the received or reflected light increases upon detection of an object by means of the detection light, a ceiling or peak region of the curve indicative of change of the received light amount is used as the near-peak region, unlike the case of FIG. 7. Reflected light can be detected satisfactorily even with the use of a reflection-type photoelectric sensor if wafers have smooth outer peripheral surfaces, and thus advantages similar to those described above can be achieved.

Moreover, the photoelectric sensor 11 may be fixed and the wafer carrier 30 may be moved instead, unlike the above-described arrangement of the first embodiment.

A wafer detection apparatus according to a second embodiment of the present invention will be now described.

The first embodiment described above is constructed as follows: The light emitting section and the light receiving section of the transmission-type photoelectric sensor are arranged on opposite sides of a wafer carrier in which wafers are stacked one upon another, in a manner facing each other so that light emitted from the light emitting section may pass through the wafer carrier and reach the light receiving section. Both the light emitting section and the light receiving section are moved, and a width of a flat bottom region of the received light amount curve in which the received light amount drops due to the presence of a wafer, that is, a range in which the differential of the received light amount is zero and which starts from a point at which the differential changes from a negative value to zero, is detected. Based on the width of the flat region and the location thereof, the presence/absence of wafers as well as improper placement such as overlapping of two wafers or warp of wafers are detected.

The thickness of a wafer or wafers, however, is not necessarily accurately reflected in the width of a flat region of the curve in which the received light amount drops. Specifically, where two wafers overlap each other, the width of the flat bottom region, that is, the range in which the differential equals zero, is not necessarily twice as wide as that observed when only one wafer is present.

The first reason is that, of the light incident on the light receiving section which is actually the sum of direct incident light and indirect incident light (light reaching the light receiving section after being reflected by a wafer to be detected or by an adjacent wafer or wafers), the indirect incident light reaches the light receiving section differently depending on various conditions, that is, depending on whether or not the wafer to be detected is warped, whether or not the wafer is deflected due to its own weight, whether or not there is an adjacent wafer(s), etc.

The second reason is that the deflection of two overlapped wafers caused due to their own weight is smaller than that of a single wafer.

For these reasons, with the aforementioned method of detecting the placement of a wafer based on the range in which the differential of the received light amount is zero, the presence/absence of a wafer can be detected with satisfactory accuracy, but where a wafer has a warp falling within an allowable range, it may possibly be judged that two wafers are overlapped, though in actuality only one wafer is received, or conversely that only one wafer is present, though two wafers are overlapped.

The wafer detection apparatus according to the second embodiment of the present invention can detect the state of placement of wafers with higher accuracy and is constructed in the manner described below.

The wafer detection apparatus according to the second embodiment will be now described in detail with reference to the drawings.

Figure 10:
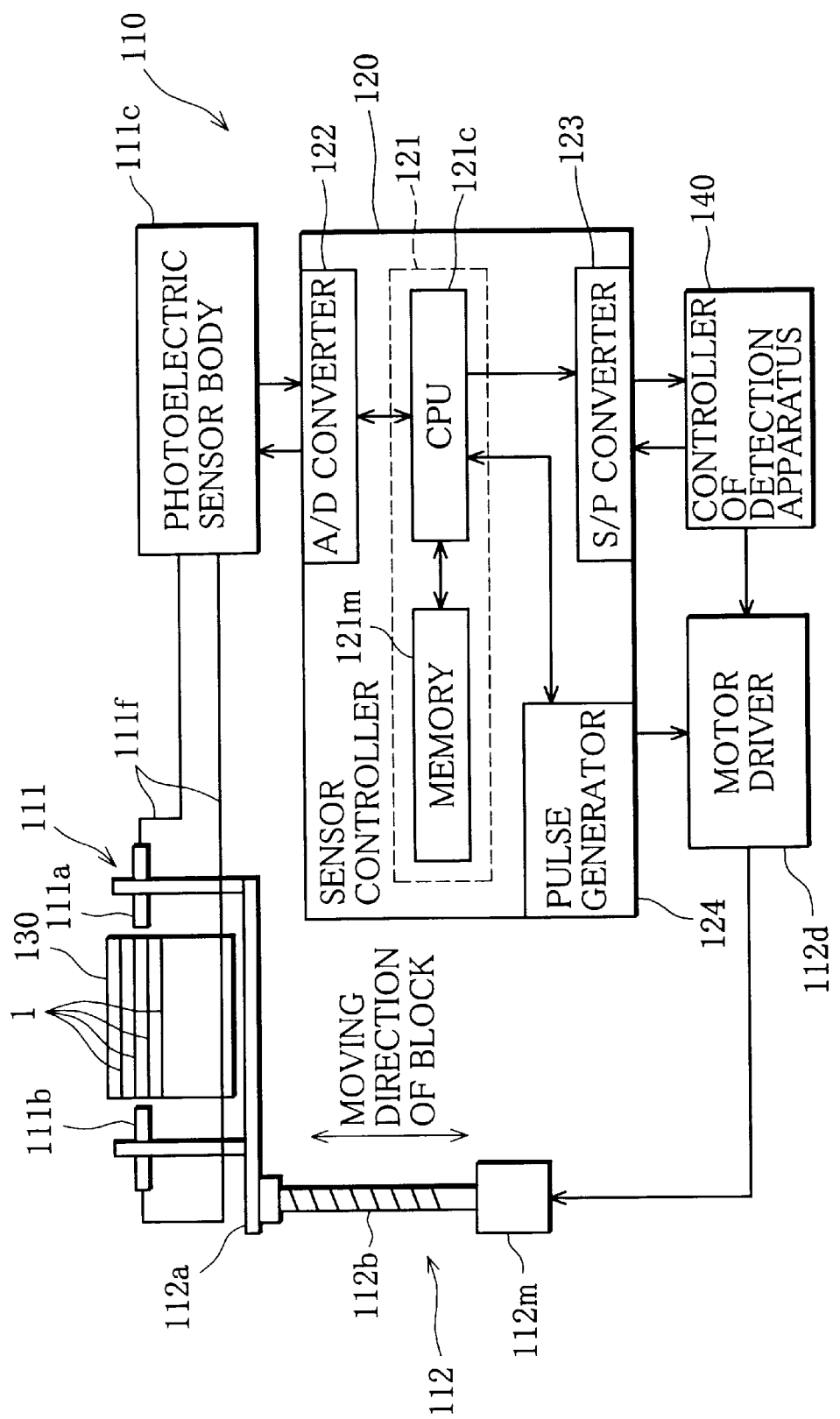
FIG. 10 is a schematic diagram showing the arrangement of a wafer detection apparatus according to second to fourth embodiments of the present invention.

A wafer detection apparatus 110 of the second embodiment, shown in FIG. 10, comprises a photoelectric sensor 111 for emitting detection light to each wafer 1 and receiving the detection light, a drive mechanism 112 for moving the photoelectric sensor 111 along a wafer carrier 130, a sensor controller 120 for detecting the state of placement of each wafer 1 in the carrier 130 based on the light received at each detection position of the photoelectric sensor 111 moved by the drive mechanism 112, etc.

The photoelectric sensor 111 is constructed in the same manner as that of the aforementioned wafer detection apparatus 10 of the first embodiment shown in FIG. 1, and comprises a light emitting section 111*a*, light receiving section 111*b*, a sensor body 111*c*, connecting means 111*f*, etc.

Like the wafer carrier 30 shown in FIG. 1, the wafer carrier 130 has wafer receiving stages (wafer receiving sections) formed on the inner walls thereof such that a plurality of wafers 1 can be stacked one upon another. The wafer carrier 130 is capable of transmitting the detection light therethrough; therefore, when the detection light is emitted from the light emitting section 111*a*, the amount of light received by the light receiving section 111*b* decreases substantially if a wafer 1 is present in the optical path of the detection light, and does not decrease if the detection light directly reaches the light receiving section 111*b* without passing through the wafer 1. If the wafer carrier 130 has a flaw or a parting line in a portion thereof and the detection light passes through such a portion, part of the detection light scatters and thus the amount of received light slightly decreases.

The light emitting section 111*a* and the light receiving section 111*b* are mounted on a ball screw 112*b* via an axially movable sensor slide block 112a and are moved in the vertical direction, as shown in the figure, by a pulse motor 112m, as in the first embodiment. The pulse motor 112m is supplied with drive pulses from a pulse generator 124, and information on detection position of the light receiving section 111b is successively supplied to a CPU 121c, described later.

The photoelectric sensor body 111c is electrically connected to the sensor controller 120, and the pulse motor 112m is also electrically connected to the sensor controller 120 via a motor driver 112d. Further, the sensor controller 120, a controller 140 of the detection apparatus, and the motor driver 112d are electrically connected to each other.

The sensor controller 120 comprises a determining section 121 including a storage device, that is, a memory 121m, and the CPU 121c and serving as determining means for detecting the presence/absence of each wafer 1 as well as the state of placement thereof, an A/D converter 122 connected between the determining section 121 and the sensor body 111c, an S/P converter 123 connected between the controller 140 and the determining section 121, the aforementioned pulse generator 124 connected between the motor driver 112d and the determining section 121, etc.

Figure 11:
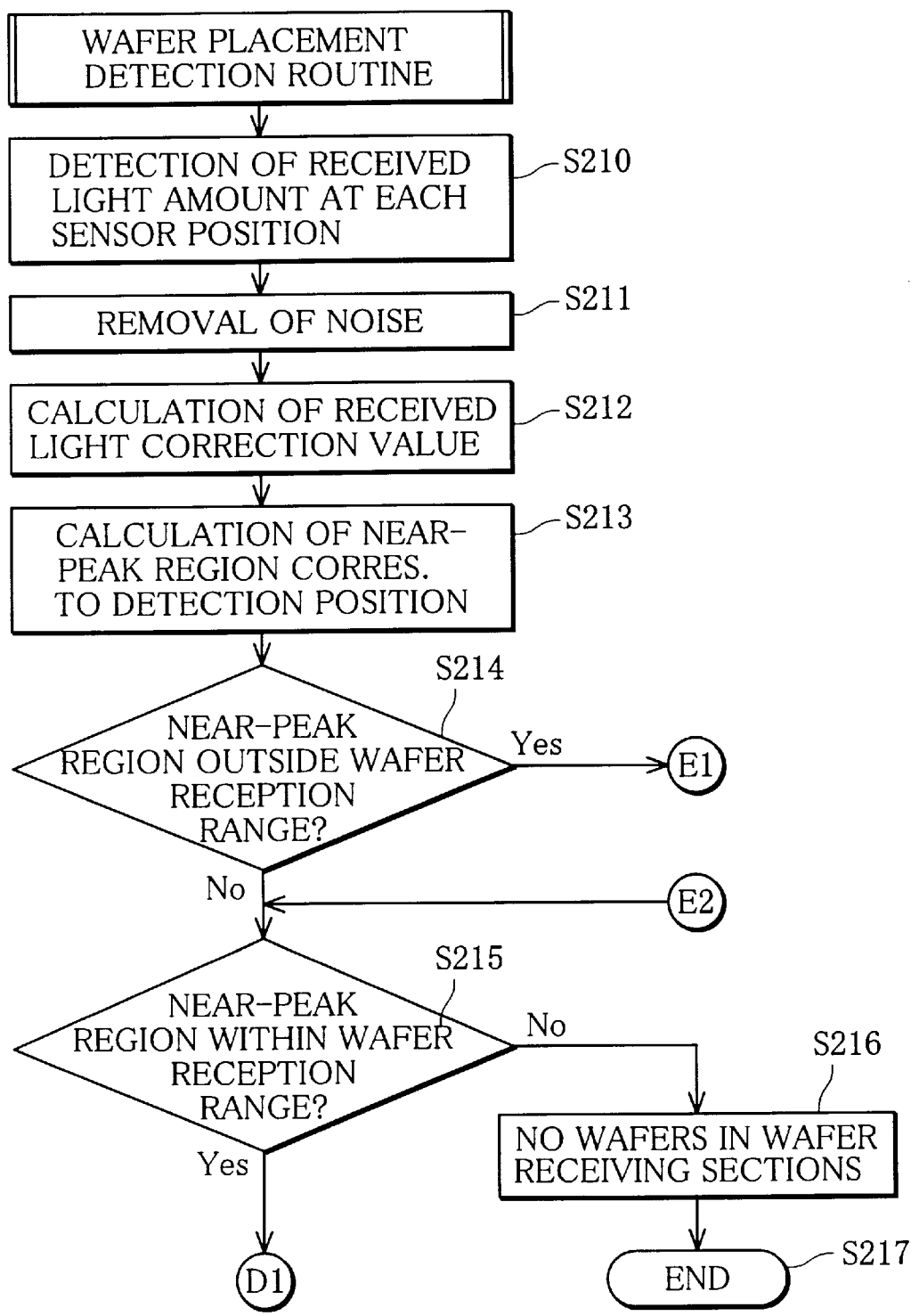
FIG. 11 is part of a flowchart showing a procedure for detecting the presence/absence and improper placement of wafers by the wafer detection apparatus according to the second embodiment of the present invention.
Figure 12:
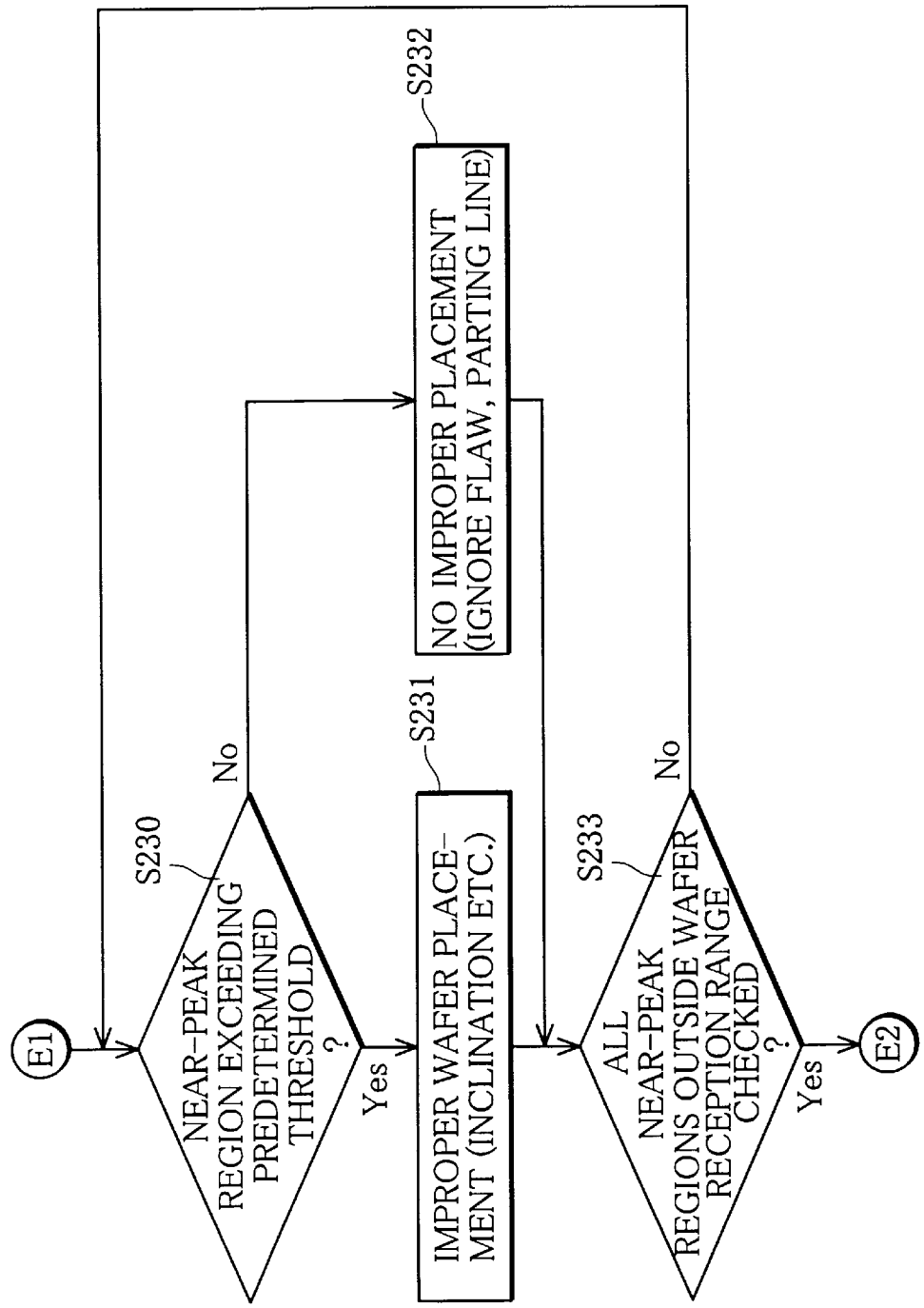
FIG. 12 is a part of the flowchart following the part shown in FIG. 11.
Figure 13:
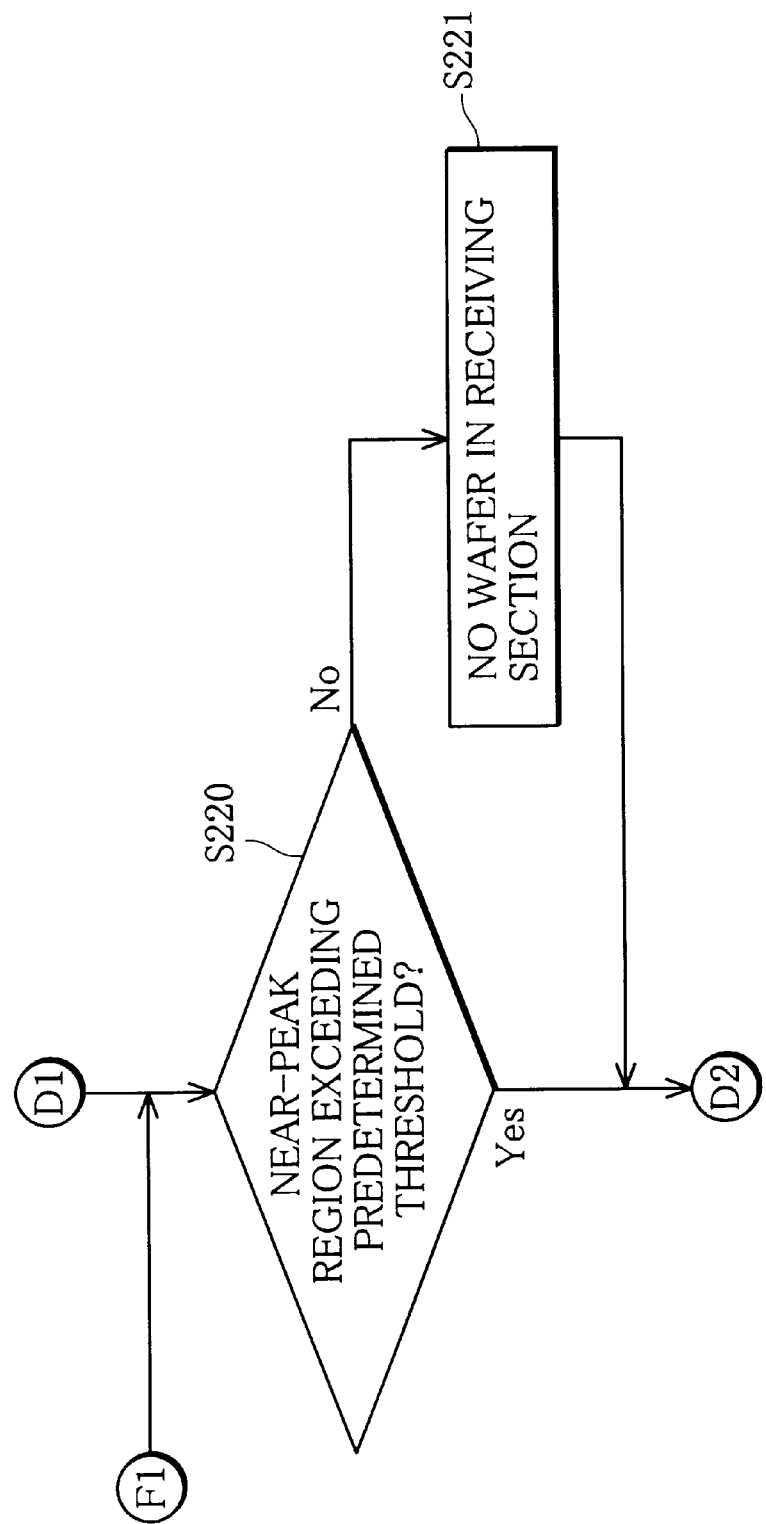
FIG. 13 is another part of the flowchart following the part shown in FIG. 11.
Figure 14:
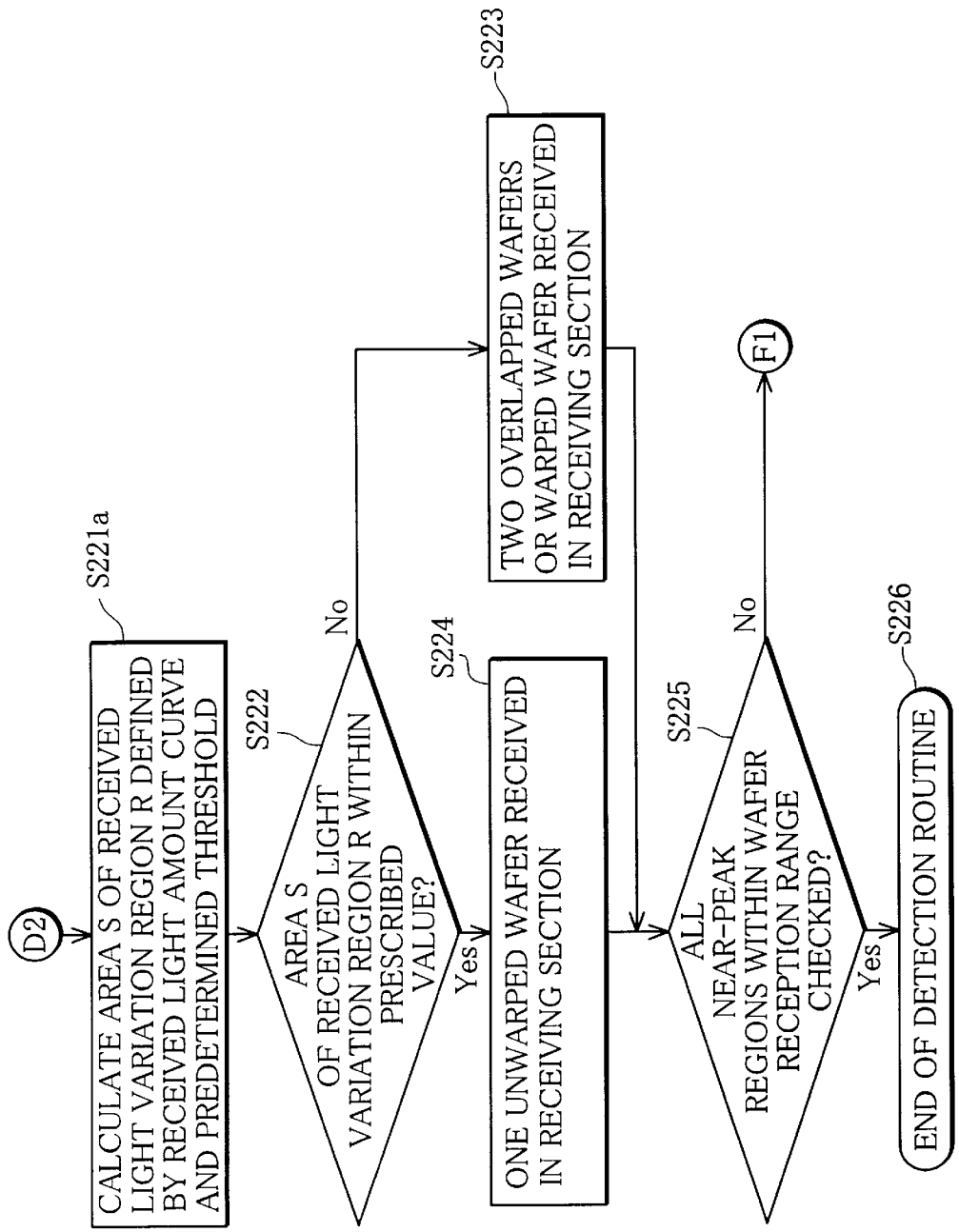
FIG. 14 is the remaining part of the flowchart following the part shown in FIG. 13.

Referring now to the flowcharts of FIGS. 11 through 14, how the presence/absence and placements of wafers are detected using the wafer detection apparatus 110 constructed as above will be described. The detection of the presence/absence of wafers shown in FIGS. 11 to 13 is carried out following the same procedure as in the wafer presence/absence detection of the first embodiment shown in FIGS. 2 to 4, as described in detail below.

To detect wafers and placements thereof, the pulse motor 112m is driven to move the light emitting section 111a and the light receiving section 111b of the photoelectric sensor 111 along the wafer carrier 130 and detection light is emitted and received by the sensor 111 during the movement to detect the amount of light received at each detection position (Step 210). The detection analog output of the photoelectric sensor is subjected to A/D conversion at the A/D converter 122, and the resulting data indicative of the amount of received light at each detection position is supplied to the determining section 121. Subsequently, the received light amount data obtained at each detection position is subjected to a smoothing process to remove noise (Step 211). As such smoothing for noise removal, S/W (software) filtering is performed inside the CPU 121c. Alternatively, H/W (hardware) filtering may be performed inside the photoelectric sensor body 111c. This smoothing process provides detection data indicative of the received light amount at each detection position, as indicated by the broken lines in FIG. 6 explained above with reference to the first embodiment, and the data is then stored in the memory 121m.

The received light amount is then subjected to automatic correction (Step 212). The correction is performed in order to absorb changes in the state of transmission of the detection light through the wafer carrier caused due to difference in type of wafer carriers and variation with time. Specifically, a reference wafer carrier is selected in advance, and with the photoelectric sensor located at a predetermined position (hereinafter referred to as "origin") of the reference wafer carrier where the detection light does not pass through a wafer, the amount of received light is measured and stored in the memory 121m as a reference value. Then, the amount of received light obtained at the origin of the wafer carrier 130, with respect to which the presence/absence and placements of wafers are to be detected, is compared with the reference value, and a deviation between the two is set as a correction value. In FIG. 6, the correction value corresponds to x. Using the correction value, the received light amount at each detection position, obtained in Step 211, is corrected. The correction may be achieved by simply shifting the measured amount of received light (adding or subtracting the correction value); alternatively, where the carrier has a transmittance different from that of the reference carrier, multiplication may be performed for proportional correction. Also, the above reference value may be measured only once so that it can be used repeatedly thereafter when wafers in individual wafer carriers are to be detected; alternatively, the reference value may be measured for each wafer carrier to be used in the detection of wafers therein. As a result of the correction, corrected data of the received light amount is obtained, as indicated by the solid lines in FIG. 6 explained above with reference to the first embodiment.

Thus, by subjecting the received light amount data obtained at each detection position by the photoelectric sensor 111 to the noise removing process and the correction process, the received light amount data as shown in FIG. 7, for example, is obtained as explained above with reference to the first embodiment. Based on this received light amount data, the presence/absence and placement of each wafer are detected following the procedure described below.

The CPU 121c calculates the gradient of the curve of the received light amount data shown in FIG. 7 and obtains, as a near-peak region, a region of the curve in which the differential indicative of change in received light amount is zero (Step 213). The near-peak region may include a region in which the differential is very small and nearly equal to zero.

In this embodiment, that is, where the photoelectric sensor is a transmitted light-detection type, the region in which the differential indicative of change in received light amount is zero corresponds to a bottom of the curve shown in FIG. 7; on the other hand, where the sensor used is a reflected light-detection type unlike the embodiment, the region corresponds to a ceiling or peak region in a similar graph showing change in received light amount. Thus, the near-peak region is a region in which the first-order differential of received light amount is substantially zero, and not a region in which the second-order differential of same is substantially zero.

Simultaneously with the calculation of the above differential, the smoothing process for removing noise may also be performed.

As a result of the calculation of the differential, three near-peak regions, for example, are derived from the received light amount curve as shown in FIG. 7. The near-peak regions detected in this case include a near-peak region indicative of a wafer as well as a near-peak region indicative of a flaw including a parting line, etc. To detect the presence/absence of a wafer, therefore, it is necessary to exclude a near-peak region indicative of a flaw etc. of a wafer carrier including a parting line from the near-peak regions calculated in Step 213. The near-peak region to be excluded can be detected at a position falling within a range where a wafer should originally be received and at a position outside the range, and false near-peak regions detected at such positions are excluded following the procedure described below.

First, it is determined whether or not the detected near-peak region is outside a wafer reception range which includes a wafer receiving section (stage) and its nearby regions (Step 214). The light receiving section of the photoelectric sensor 111 receives the detection light while being moved at a predetermined speed by the pulse motor 112m along the ball screw 112b, and information on the position of the photoelectric sensor 111 is successively provided to the CPU 121c from the pulse generator 124. Accordingly, whether the detection position of the sensor 111 is within the wafer reception range or not, as shown in FIG. 7, can be easily determined.

If the near-peak region is outside the wafer reception range, it is determined whether or not the near-peak region exceeds a predetermined threshold (Step 230). The predetermined threshold is a prescribed value obtained based on experiments conducted with respect to individual types of wafer carrier 130, wafers, etc., and in the case of the transmission-type photoelectric sensor 111, is set to a value slightly smaller than an amount of received light observed when the light has passed through a parting line as equivalent to the greatest allowable flaw.

If the predetermined threshold is exceeded by the near-peak region, that is, if the received light amount is smaller than the threshold shown in FIG. 7, then it means that some obstacle obstructing the propagation of the detection light is present at a position where a wafer should originally not be located, and it is judged as the most probable situation that a wafer is improperly received, for example, slantingly received, in the nearest wafer receiving section (Step 231).

On the other hand, if the predetermined threshold is not exceeded by the near-peak region, that is, if the received light amount is not smaller than the threshold shown in FIG. 7, it is judged that a reduction in the received light amount has been merely caused by scattering of part of the detection light by a flaw or a parting line of the wafer carrier 130, and not by a wafer or some other obstacle, and a conclusion is made that there is no improper placement of wafer, ignoring such a slight reduction of the received light amount (Step 232). In FIG. 7, the predetermined threshold is set at a value slightly smaller than an amount of received light observed when the light has passed through a parting line as equivalent to the greatest allowable flaw.

It is then determined whether or not the aforementioned Steps 230 to 232 have been executed for all near-peak regions detected outside the wafer reception range (Step 233), and if not, the steps are repeatedly executed for the remaining near-peak regions.

Subsequently, it is determined whether or not there is a near-peak region detected within the wafer reception range (Step 215); if not, it is judged that no wafer is received in the wafer receiving sections of the wafer carrier (Step 216) and the detection of wafers is ended (Step 217).

If there is a near-peak region detected in the vicinity of the wafer receiving section (within the wafer reception range), it is determined whether or not the predetermined threshold is exceeded by the near-peak region (Step 220). If the predetermined threshold is not exceeded by the near-peak region, it is judged that the detection light has not passed through a wafer, and accordingly, that there is no wafer in the receiving section concerned (Step 221). Thus, even when no wafer is present in the wafer reception range and at the same time a flaw, a parting line or the like exists in this reception range of the wafer carrier 130, such a flaw or a parting line is ignored, as in the case of Step 232.

If it is judged in Step 220 that the predetermined threshold is exceeded by the near-peak region detected within the wafer reception range, it is judged that a wafer is received in the wafer receiving section, followed by a determination as to whether the wafer is placed properly or improperly (Steps 221a to 225).

Figure 17:
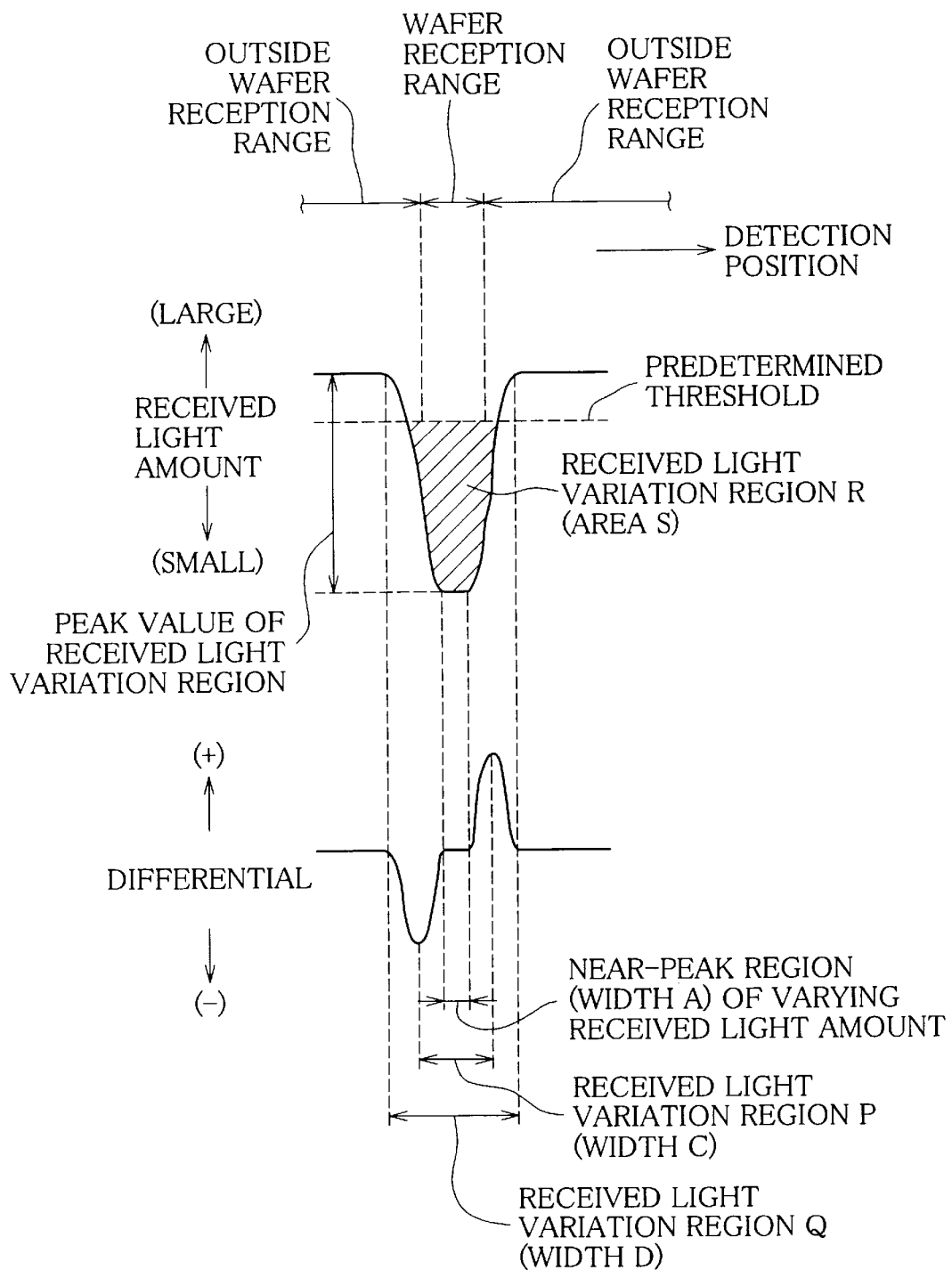
FIG. 17 is a diagram illustrating how the placement of a wafer is detected in the vicinity of a wafer receiving position by the wafer detection apparatus according to the present invention.

In the determination routine, first, a received light variation region R (hatched region in FIG. 17) is set which is defined by the received light amount curve and a straight line indicative of the predetermined threshold used in Step 220, as shown in FIG. 17, and an area S of the received light variation region R is calculated (Step 221a).

Subsequently, it is determined whether or not the area S of the received light variation region R is within a prescribed value (Step 222), and if the former is greater than the latter, it is judged that two overlapped wafers or a warped wafer is received in the receiving section concerned (Step 223). The prescribed value referred to herein is a fixed threshold by which the area of a received light variation region obtained when a single wafer is properly received can be distinguished from the area of a received light variation region obtained when a warped wafer or two overlapped wafers are received.

Figure 18:
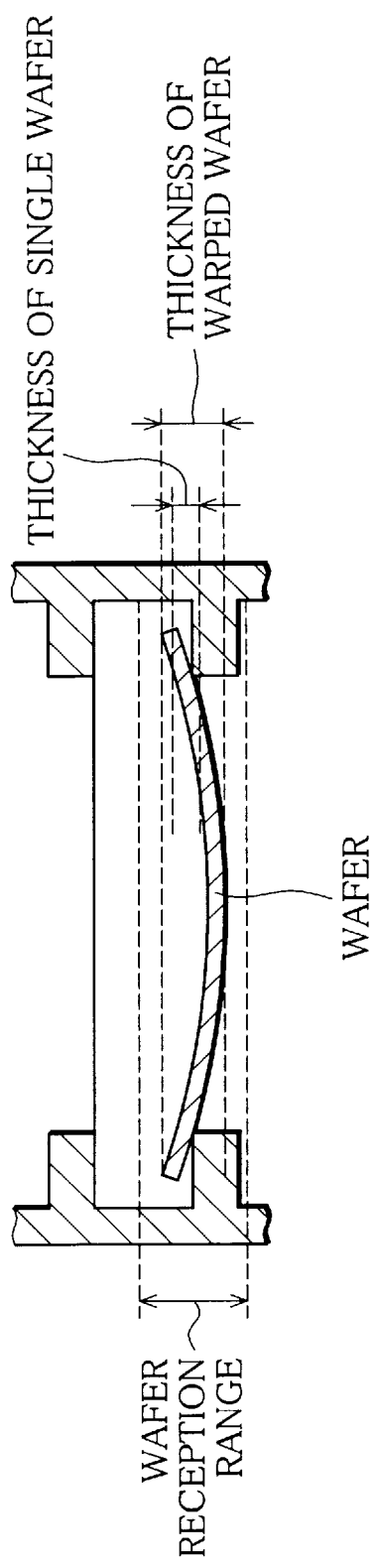
FIG. 18 is a view showing a state in which a warped wafer is contained in the wafer carrier.
Figures 19A, 19B:
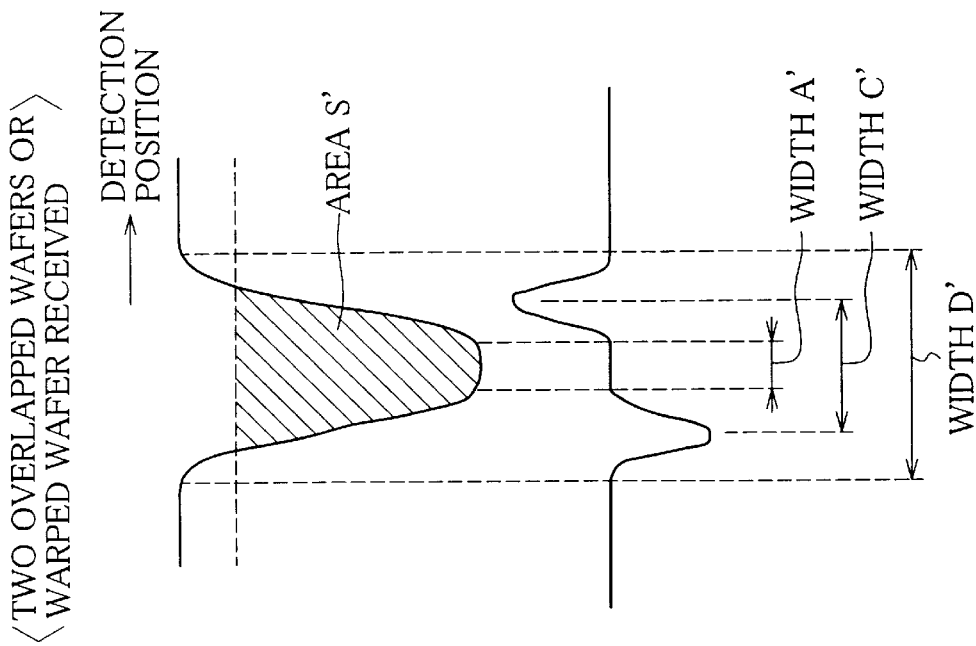
FIG. 19a and FIG. 19b illustrate how the placements of wafers are detected by the wafer detection apparatus according to the present invention.

For example, when a warped wafer is received as shown in FIG. 18, the received light variation region (FIG. 19(b)) then obtained with such a warped wafer is apparently greater than the received light variation region (FIG. 19(a)) obtained with an unwarped wafer, as shown in FIG. 19. Thus, there is a marked difference between the area of the received light variation region obtained with a warped wafer and that of the received light variation region obtained with an unwarped wafer, and by comparing the values of the areas, it is possible to detect with ease the placement of a warped wafer without fail. Overlapping of two wafers can also be easily detected in like manner in accordance with the size of the area of the received light variation region.

Overlapping of two wafers or a warp of a wafer may be detected in accordance with the width of the region in which the differential of the varying received light amount is zero, that is, in accordance with the width of a flat bottom region of the received light amount curve as shown in (a) and (b) of FIG. 19 (i.e., the region located between the trough and the crest in the gradient of the curve of the received light amount data). In this case, however, there is no significant difference in the region in which the differential is zero (width A' and width A) between the case where a warped wafer is received (FIG. 19(b)) and the case where an unwarped wafer is received (FIG. 19(a)), as will be clear from (a) and (b) of FIG. 19. Therefore, improper placement of wafers can be detected with higher accuracy in accordance with the size of the area of the received light variation region, as mentioned above.

If the area S of the received light variation region R is found to be within the prescribed value, it is judged that a single unwarped wafer is received in the receiving section concerned (Step 224).

Then, the aforementioned Steps 220 through 224 are executed for all near-peak regions within the wafer reception ranges (Step 225), and the detection of the presence/absence and placements of wafers is ended (Step 226). The detection results obtained by the sensor controller 120 are output to the controller 140.

It is to be noted that the detection routine described above is given just as an example of the procedure for detecting the presence/absence and placements of wafers, and other detection routines may of course be conceivable without departing from the spirit and scope of the invention in the appended claims.

A wafer detection apparatus according to a third embodiment of the present invention will be now described.

As distinct from the wafer detection apparatus of the second embodiment in which the placement of each wafer is detected based on the area of the aforementioned received light variation region, the wafer detection apparatus of the third embodiment is characterized in that improper placement of wafers is detected based on the width of a received light variation region defined between adjacent minimal and maximal points of the differential of the received light amount which varies with the detection position information, as well as on the peak value of the received light amount in this received light variation region.

Specifically, as shown in FIG. 17, a region of the received light amount curve defined between adjacent minimal and maximal points of the differential of the varying received light amount is set as a received light variation region P, and it is determined whether or not the width C of the received light variation region P and the peak value of the received light amount in the same region P are within respective prescribed values, to determine whether a single wafer is properly received in the wafer receiving section or a wafer(s) are improperly received in the receiving section (two overlapped wafers or a warped wafer is received).

A wafer placement detection routine executed in the wafer detection apparatus of the third embodiment will be now described.

The processing routine of the second embodiment shown in FIGS. 11 to 13, that is, the processing routine including Steps 210 to 217, 220, 221, and 230 to 233 is used also in the wafer placement detection routine of the third embodiment.

Figure 15:
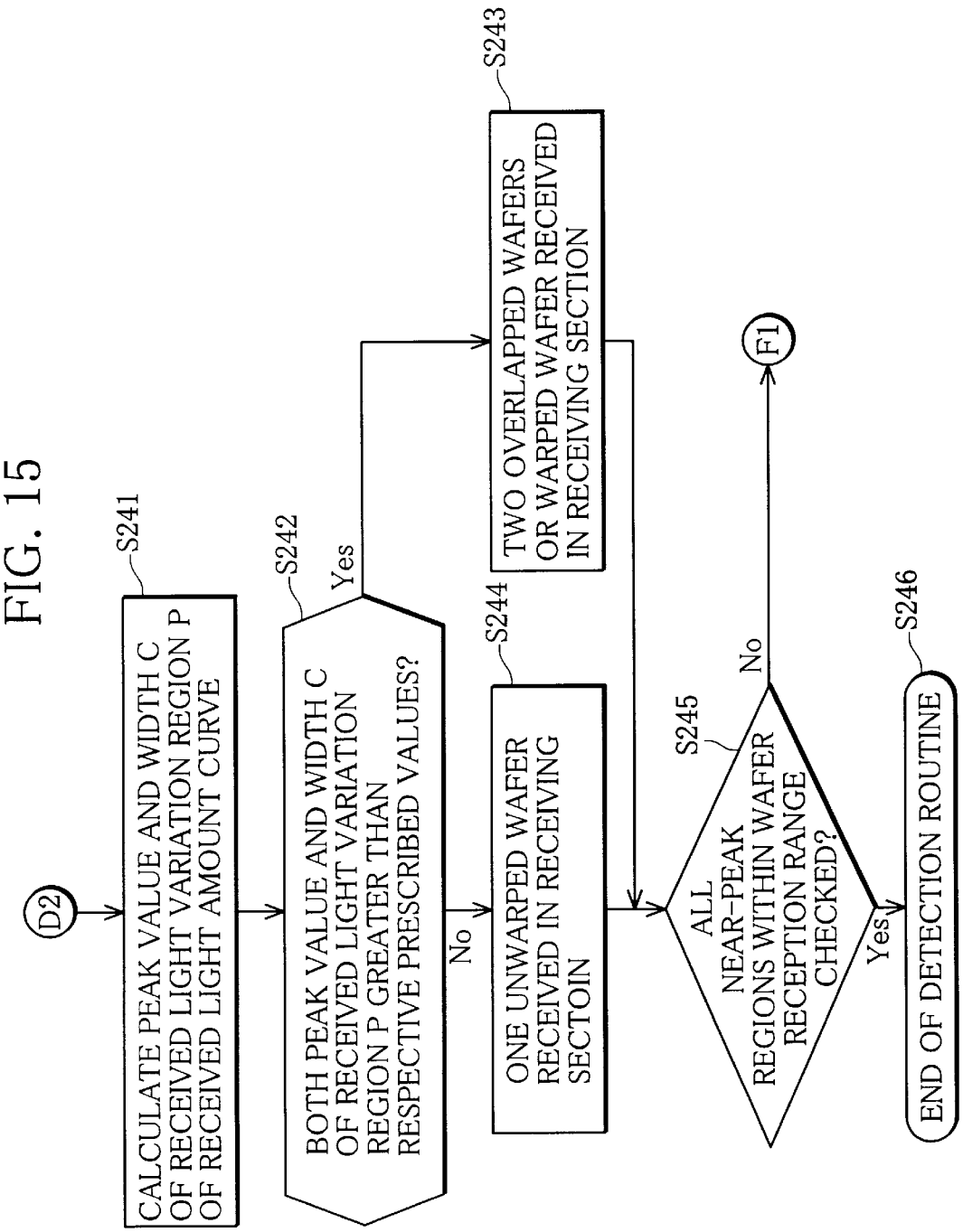
FIG. 15 is part of a flowchart corresponding to FIG. 14, showing how improper placement of wafers is detected by the wafer detection apparatus according to the third embodiment of the present invention.
Figure 16:
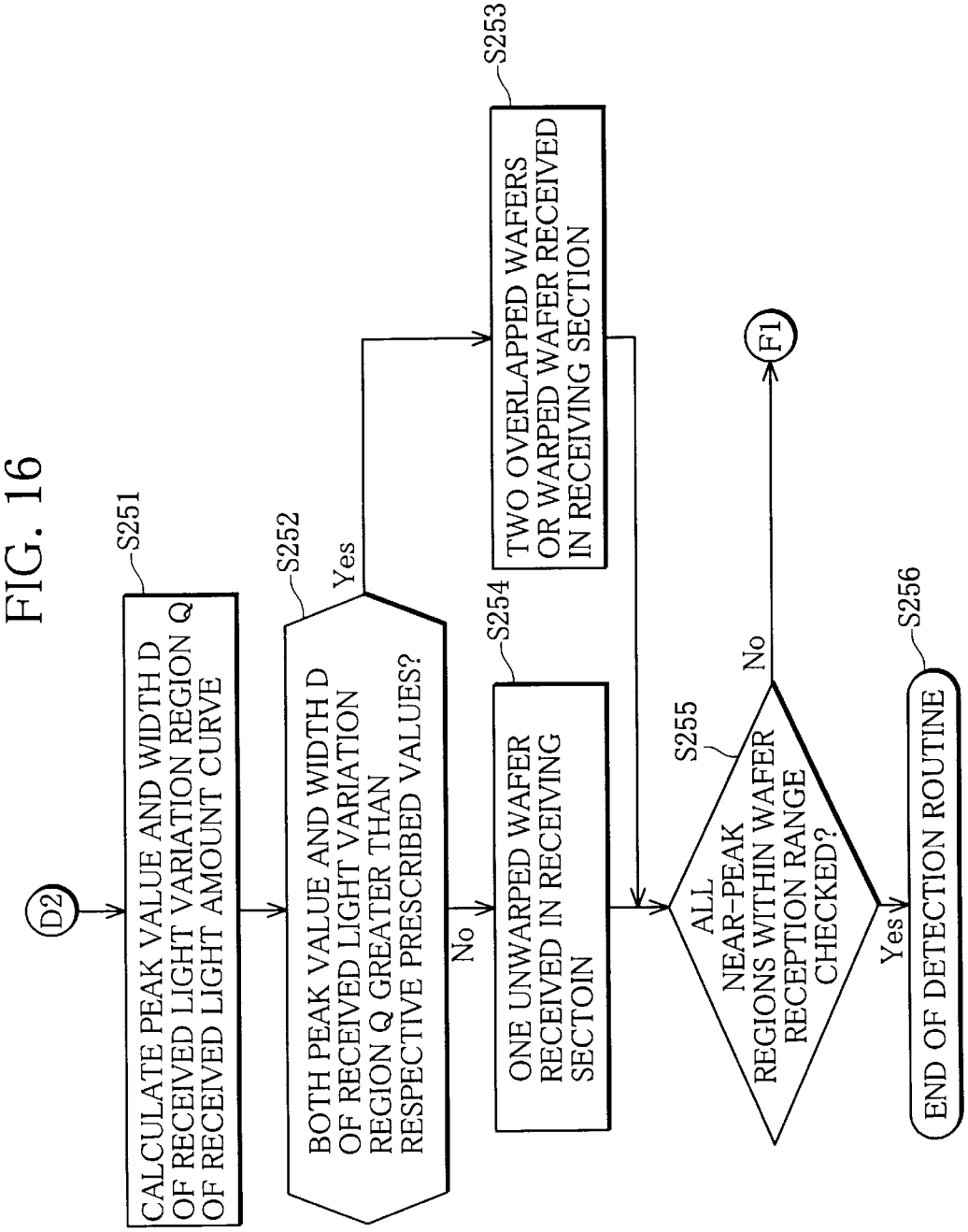
FIG. 16 is part of a flowchart corresponding to FIG. 14, showing how improper placement of wafers is detected by the wafer detection apparatus according to the fourth embodiment of the present invention.

In the third embodiment, after Steps 220 and 221 are executed, the width C of the received light variation region P, which is a specified interval of the received light amount curve, and the peak value of the received light amount in the same region are calculated (Step 241), as shown in FIG. 15.

It is then determined whether or not both of the width C of the received light variation region P and the peak value of the received light amount in the region P are greater than respective prescribed values (Step 242), and if both of these are greater than the respective prescribed values, it is judged that two overlapped wafers or a warped wafer is received in the receiving section concerned (Step 243). The prescribed values used in this case are thresholds by which proper placement of a single wafer and improper placement of a wafer(s) (warp of a wafer or overlapping of two wafers) can be discriminated from each other.

More specifically, where a warped wafer is received as shown in FIG. 18, there is a clear difference between the width C' (FIG. 19(b)) of a received light variation region obtained with such a warped wafer and the width C (FIG. 19(a)) of a received light variation region obtained with an unwarped wafer, as shown in FIG. 19, and thus a warped wafer can be easily detected without fail. Overlapping of two wafers can also be easily detected in like manner based on the width C and the peak value of the received light variation region.

If it is judged that at least one of the width C of the received light variation region P and the peak value of the received light amount in the same region P is within the corresponding prescribed value, a conclusion is made that a single unwarped wafer is received in the receiving section concerned (Step 244).

Then, the aforementioned Steps 240 through 244 are executed for all near-peak regions within the wafer reception ranges (Step 245), and the detection of the presence/absence and placements of wafers is ended (Step 246). The detection results obtained by the sensor controller 120 are output to the controller 140. According to the above-described procedure, not only the presence/absence of wafers but the placements thereof can be detected without fail.

A wafer detection apparatus according to a fourth embodiment of the present invention will be now described.

As distinct from the wafer detection apparatus of the second embodiment in which the placement of each wafer is detected based on the area of the received light variation region, the wafer detection apparatus of the fourth embodiment is characterized in that improper placement of wafers is detected based on the width of a received light variation region which includes adjacent minimal and maximal points of the differential of the received light amount varying with the detection position information and which is defined between a point at which the differential changes from zero to a negative value and a point at which the differential changes from zero to a positive value, as well as on the peak value of the received light amount in this received light variation region.

Specifically, as shown in FIG. 17, a region of the received light amount curve which includes adjacent minimal and maximal points of the differential of the varying received light amount and which is defined between a point at which the differential changes from zero to a negative value and a point at which the differential changes from zero to a positive value is set as a received light variation region Q, and it is determined whether or not the width D of the received light variation region Q and the peak value of the received light amount in the same region Q are within respective prescribed values, to determine whether a single wafer is properly received in the wafer receiving section or a wafer(s) are improperly received in the receiving section (two overlapped wafers or a warped wafer is received).

A wafer placement detection routine executed in the wafer detection apparatus of the fourth embodiment will be now described.

The processing routine of the second embodiment shown in FIGS. 11 to 13, that is, the processing routine including Steps 210 to 217, 220, 221, and 230 to 233 is used also in the wafer placement detection routine of the fourth embodiment.

In the fourth embodiment, after Steps 220 and 221 are executed, the peak value of the received light amount in the received light variation region Q, which is a specified interval of the received light amount curve, and the width D of the same region are calculated (Step 251).

It is then determined whether or not both of the width D of the received light variation region Q and the peak value of the received light amount in the same region Q are greater than respective prescribed values (Step 252), and if both of these are greater than the respective prescribed values, it is judged that two overlapped wafers or a warped wafer is received in the receiving section concerned (Step 253). The prescribed values used in this case are thresholds by which proper placement of a single wafer and improper placement of a wafer(s) (warp of a wafer or overlapping of two wafers) can be discriminated from each other.

As in the case of the preceding two embodiments described above, there is a clear difference between the width D (FIG. 19(a)) of a received light variation region Q obtained with an unwarped wafer and the width D' (FIG. 19(b)) of a received light variation region Q' obtained with a warped wafer, and thus a warped wafer can be easily detected without fail. Overlapping of two wafers can also be easily detected in like manner based on the width D and the peak value of the received light variation region.

If it is judged that at least one of the width D of the received light variation region Q and the peak value of the received light amount in the same region Q is within the corresponding prescribed value, a conclusion is made that a single unwarped wafer is received in the receiving section concerned (Step 254).

Then, the aforementioned Steps 250 through 254 are executed for all near-peak regions within the wafer reception ranges (Step 255), and the detection of the presence/absence and placements of wafers is ended (Step 256). The detection results obtained by the sensor controller 120 are output to the controller 140. According to the above-described procedure, not only the presence/absence of wafers but the placements thereof can be detected without fail.

In the second to fourth embodiments described above, objects to be detected are not limited to semiconductor wafers, as in the case of the wafer detection apparatus of the first embodiment, and the wafer detection apparatus may be used to detect the presence/absence and placements of hard disks, CDs (compact disks), etc. contained in cassettes.

Further, although a transmission-type photoelectric sensor is used in the second embodiment, a reflection-type photoelectric sensor may alternatively be used in such a manner that based on the received light variation region R derived from the reflected light, the placement of an object is detected. In this case, since the amount of the received or reflected light increases upon detection of an object by means of the detection light, a ceiling or peak region in which the received light amount is greater than a fixed threshold is set as the received light variation region R, unlike the case shown in FIG. 17. Reflected light can be detected satisfactorily even with the use of a reflection-type photoelectric sensor if wafers have smooth outer peripheral surfaces, and thus advantages similar to those described above can be achieved.

A reflection-type photoelectric sensor can also be used in the third and fourth embodiments described above.

Moreover, the photoelectric sensor 111 may be fixed and the wafer carrier 130 may be moved instead, unlike the above-described arrangement of the foregoing embodiments.

EXAMPLES

Figure 20:
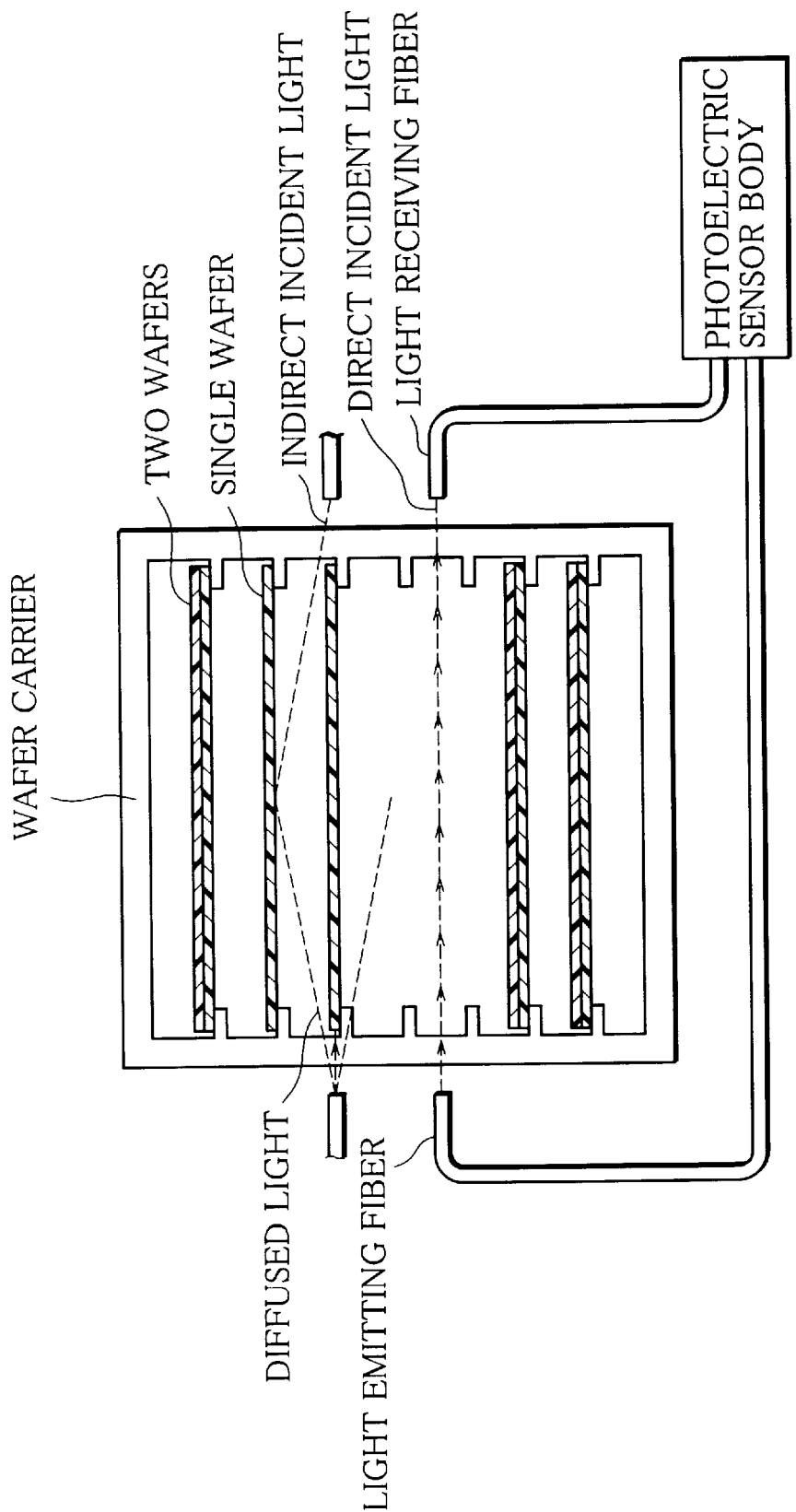
FIG. 20 is a diagram showing placements of wafers used in examples according to the present invention.

Wafers were randomly contained in a wafer carrier having seven stages of wafer receiving section therein, as shown in FIG. 20, and the placements thereof were detected with the use of the wafer detection apparatus according to the first to fourth embodiments described above.

Figure 21:
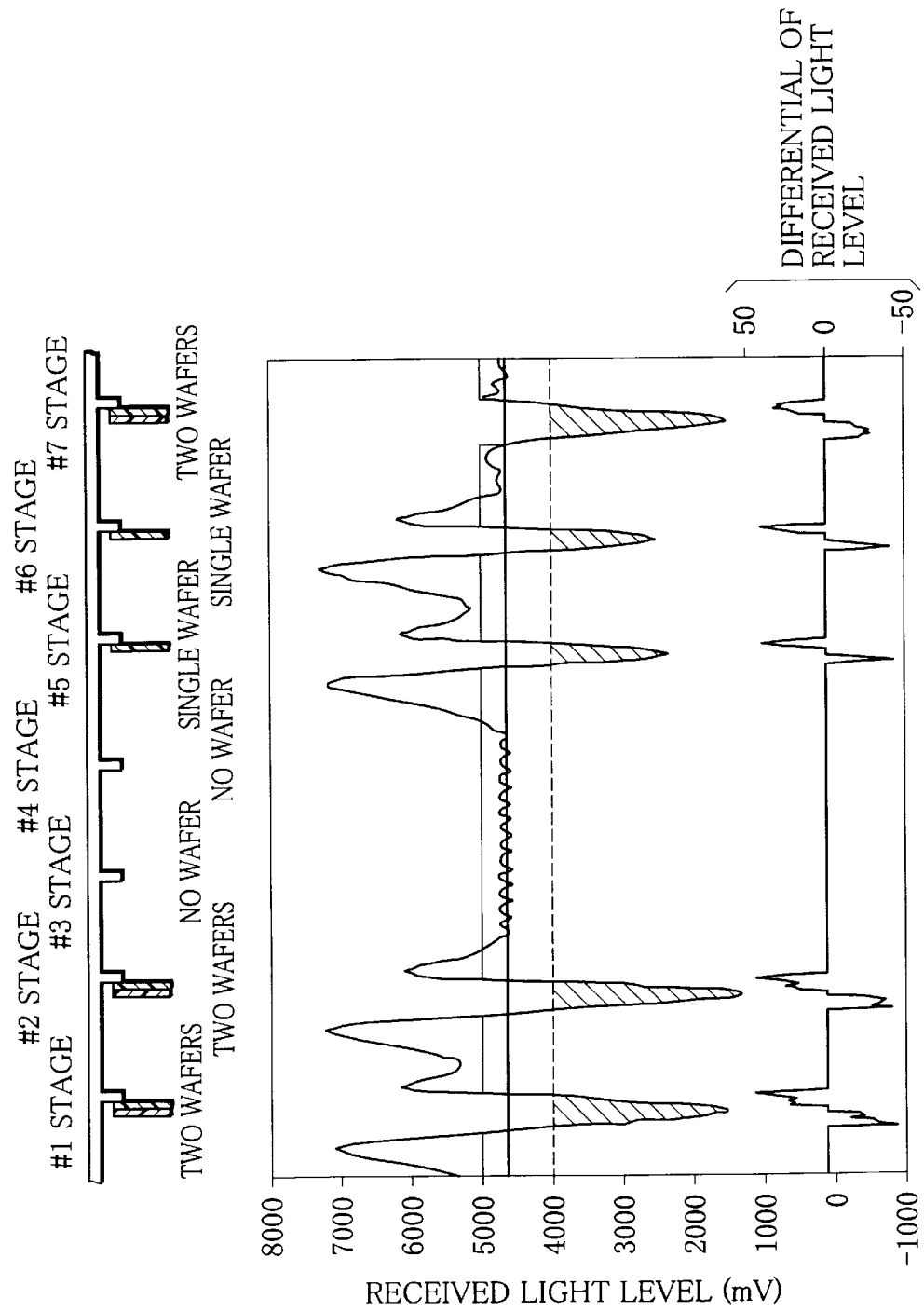
FIG. 21 is a diagram showing results of measurement of the received light amount obtained by the wafer detection apparatus in the examples of the present invention.
Figure 22:
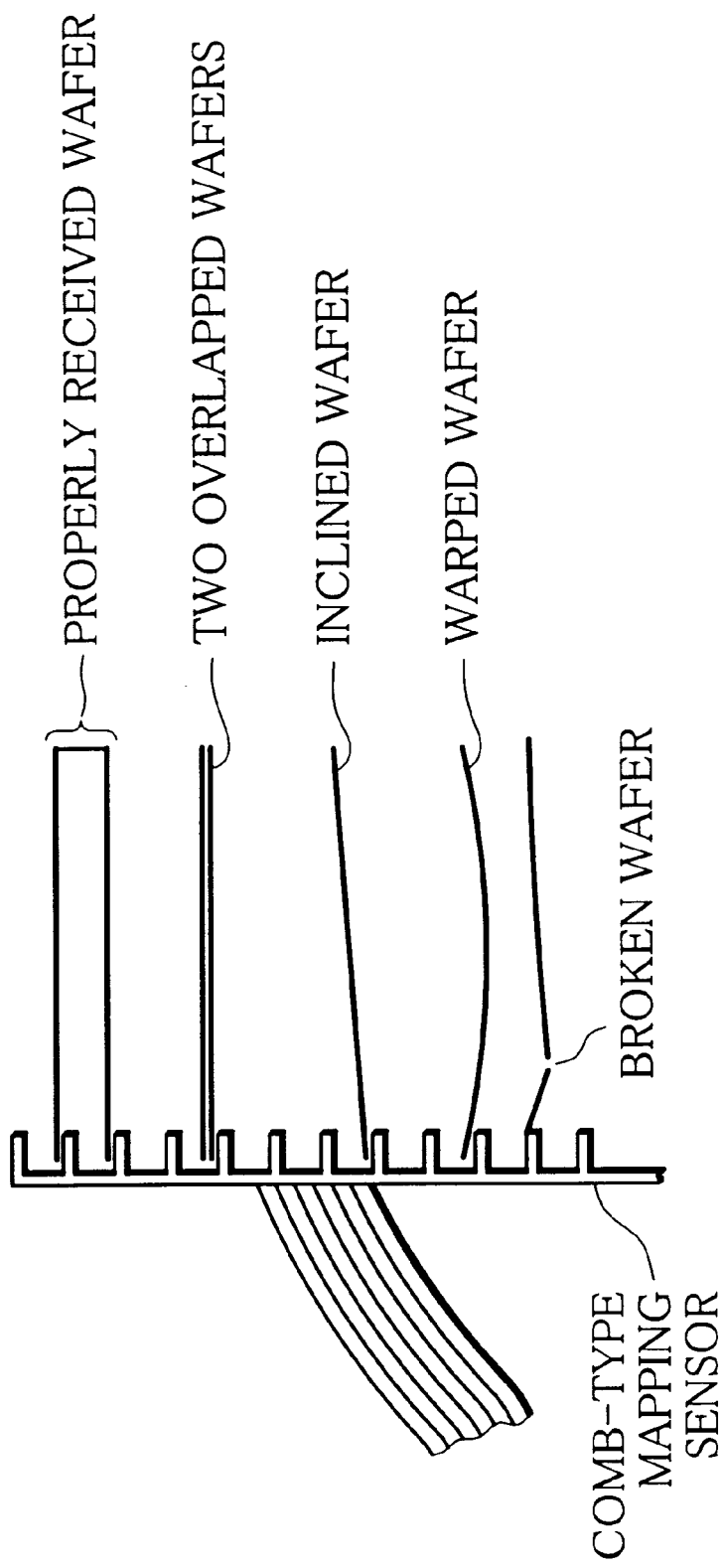
FIG. 22 is a diagram showing a conventional wafer detection technique using a comb-type mapping sensor.

As a result, the level of received light varied in a manner corresponding to wafers received in respective wafer receiving sections and the differential of the received light level also varied correspondingly, as seen from measurement results shown in FIG. 21. Based on the received light level and the differential thereof shown in the measurement results, the placements of wafers were detected using the wafer detection apparatus of the first to fourth embodiments. Table 1 below shows comparison between the results of detection by the wafer detection apparatus of the first (I), second (II), third (III) and fourth (IV) embodiments and the actual numbers of wafers received.

TABLE 1

| Stage | I (Width A) | II (Area S) | III (Width C) | IV (Width D) | Wafer detected in I | No. of wafers detected in I | No. of wafers detected in II | No. of wafers detected in III | No. of wafers detected in IV | Actual No. of wafers received |
|---|---|---|---|---|---|---|---|---|---|---|
| 7 | 0.60 | 518 | 2.48 | 3.8 | detected (∘) | 2 (∘) | 2 (∘) | 2 (∘) | 2 (∘) | 2 |
| 6 | 0.55 | 181 | 1.8 | 2.32 | detected (∘) | 2 (x) | 1 (∘) | 1 (∘) | 1 (∘) | 1 |
| 5 | 0.55 | 196 | 1.44 | 2.4 | detected (∘) | 2 (x) | 1 (∘) | 1 (∘) | 1 (∘) | 1 |
| 4 | — | — | — | — | not detected (∘) | 0 (∘) | 0 (∘) | 0 (∘) | 0 (∘) | 0 |
| 3 | — | — | — | — | not detected (∘) | 0 (∘) | 0 (∘) | 0 (∘) | 0 (∘) | 0 |
| 2 | 0.55 | 488 | 3.0 | 3.2 | detected (∘) | 2 (∘) | 2 (∘) | 2 (∘) | 2 (∘) | 2 |
| 1 | 0.45 | 472 | 3.12 | 3.4 | detected (∘) | 1 (x) | 2 (∘) | 2.(∘) | 2 (∘) | 2 |
| prescribed value | 0.50 | 351 | 2.2 | 2.8 | | | | | | |

As seen from the detected numbers of wafers shown in Table 1, when the placements of wafers were detected using the wafer detection apparatus of the first embodiment (I), the presence/absence of wafers in the individual wafer receiving sections could be accurately detected.

Further, as seen from the detected numbers of wafers shown in Table 1, where wafers were detected by the wafer detection apparatus of the second (II), third (III) and fourth (IV) embodiments in accordance with the respective detection routines, not only the presence/absence of wafers in the individual wafer receiving sections but also overlapping of two wafers could be accurately detected.

Thus, usefulness of the wafer placement detection routines according to the first to fourth embodiments of the present invention could be actually confirmed.

While preferred embodiments of the present invention have been shown and described, it will be obvious to those skilled in the art that various changes and modifications may be made without departing from the spirit and scope of the invention as hereinafter claimed.

What is claimed is:

1. A wafer detection apparatus for detecting wafers received in stages formed in a wafer carrier, comprising:

a light emitting section arranged movably in a thickness direction of wafers which are received in the stages along a peripheral wall of the wafer carrier, for emitting detection light toward a position of each stage for receiving a wafer;

a light receiving section arranged movably in the thickness direction of the wafers, for receiving the detection light emitted from said light emitting section and outputting a received light amount;

a drive mechanism for moving said light emitting section and said light receiving section together relative to the wafer carrier;

a storage device continuously supplied with an input signal from said light receiving section and storing a history of change of the received light amount; and determining means for determining whether a wafer is received in each stage of the wafer carrier or not based on a rate of change of the received light amount stored in said storage device.

2. The wafer detection apparatus according to claim 1, further comprising a position sensor for successively acquiring information on position of said light emitting section and said light receiving section relative to the wafer carrier and supplying the acquired information to said storage device as detection position information.

3. The wafer detection apparatus according to claim 1, wherein said light receiving section is a transmitted light-detection type, and said determining means detects a state of placement of each wafer based on a near-peak region of change of the received light amount defined by a range in which a differential indicative of change of the received light amount is zero and which starts from a point at which the differential changes from a negative value to zero.

4. The wafer detection apparatus according to claim 1, wherein said light receiving section is a reflected light-detection type, and said determining means detects a state of placement of each wafer based on a near-peak region of change of the received light amount defined by a range in which a differential indicative of change of the received light amount is zero and which starts from a point at which the differential changes from a positive value to zero.

5. The wafer detection apparatus according to claim 1, wherein said determining means detects a state of placement of each wafer based on an area of a received light variation region which is defined by a fixed reference value and a portion of a received light amount curve exceeding the fixed reference value.

6. The wafer detection apparatus according to claim 1, wherein said determining means detects a state of placement of each wafer based on a width of a received light variation region which is defined between adjacent minimal and maximal points of a differential indicative of change of the received light amount, as well as on a peak value of the received light amount in the received light variation region.

7. The wafer detection apparatus according to claim 1, wherein said determining means detects a state of placement of each wafer based on a width of a received light variation region which includes adjacent minimal and maximal points of a differential indicative of change of the received light amount varying with the detection position information and which is defined between a point at which the differential changes from zero to a negative value and a point at which the differential changes from zero to a positive value, as well as on a peak value of the received light amount in the received light variation region.

8. The wafer detection apparatus according to claim 1, wherein said light emitting section emits the detection light to each wafer through the wafer carrier, and said light receiving section receives the detection light from said each wafer through the wafer carrier.

9. The wafer detection apparatus according to claim 1, wherein said light emitting section emits the detection light to a predetermined position of a reference wafer carrier at which no wafer is received to measure a reference received light amount, and emits the detection light to the predetermined position of the wafer carrier with respect to which placements of wafers are to be detected to measure a detected received light amount, and said determining means compares the detected received light amount with the reference received light amount to calculate a received light correction value.

10. The wafer detection apparatus according to claim 3, wherein said determining means has a function of judging that the wafer is properly received if the near-peak region of change of the received light amount falls within a range of detection position in which a wafer is to be received and also if the near-peak region exceeds a predetermined threshold and has a width smaller than a predetermined width.

11. The wafer detection apparatus according to claim 4, wherein said determining means has a function of judging that a wafer is properly received if the near-peak region of change of the received light amount falls within a range of detection position in which a wafer is to be received and also if the near-peak region exceeds a predetermined threshold and has a width smaller than a predetermined width.

12. The wafer detection apparatus according to claim 3, wherein said determining means has a function of judging that two overlapped wafers or a warped wafer is received if the near-peak region of change of the received light amount falls within a range of detection position in which a wafer is to be received and also if the near-peak region exceeds a predetermined threshold and has a width greater than a predetermined width.

13. The wafer detection apparatus according to claim 4, wherein said determining means has a function of judging that two overlapped wafers or a warped wafer is received if the near-peak region of change of the received light amount falls within a range of detection position in which a wafer is to be received and also if the near-peak region exceeds a predetermined threshold and has a width greater than a predetermined width.

14. The wafer detection apparatus according to claim 3, wherein said determining means has a function of judging that a wafer is improperly received if the near-peak region of change of the received light amount is outside a range of detection position in which a wafer is to be received and also if the near-peak region exceeds a predetermined threshold.

15. The wafer detection apparatus according to claim 4, wherein said determining means has a function of judging that a wafer is improperly received if the near-peak region of change of the received light amount is outside a range of detection position in which a wafer is to be received and also if the near-peak region exceeds a predetermined threshold.

16. The wafer detection apparatus according to claim 8, wherein said determining means has a function of judging that the wafer carrier has a flaw or a parting line if the near-peak region of change of the received light amount is outside a range of detection position in which a wafer is to be received and also if the near-peak region does not exceed a predetermined threshold.

17. A wafer detection apparatus for detecting wafers received in stages formed in a wafer carrier, comprising:

a light emitting section arranged movably in a thickness direction of wafers which are received in the stages along a peripheral wall of the wafer carrier, for emitting detection light toward a position of each stage for receiving a wafer;

a light receiving section arranged movably in the thickness direction of the wafers, for receiving the detection light emitted from said light emitting section and outputting a received light amount;

a drive mechanism for moving said light emitting section and said light receiving section together relative to the wafer carrier;

a storage device continuously supplied with an input signal from said light receiving section and storing a history of change of the received light amount; and determining means for determining presence of the wafers and improper placement of the wafers based on a rate of change of the received light amount.

18. The wafer detection apparatus according to claim 17, wherein the determining means detects a state of placement of each wafer based on a near-peak region of change of the received light amount defined by a range in which a differential indicative of change of the received light amount is zero and which starts from a portion at which the differential changes from a negative value to zero.

19. The wafer detection apparatus according to claim 17, wherein the improper placement determined by the determining means includes overlapped wafers, a warped wafer, or inclined placement of the wafer in the wafer carrier.

* * * * *